(12) United States Patent
Okumura et al.

(10) Patent No.: US 8,624,340 B2
(45) Date of Patent: Jan. 7, 2014

(54) PLASMA PROCESSING APPARATUS AND METHOD THEREOF

(75) Inventors: Tomohiro Okumura, Osaka (JP); Ichiro Nakayama, Osaka (JP); Hiroshi Kawaura, Kanagawa (JP); Tetsuya Yukimoto, Chiba (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 13/215,276

(22) Filed: Aug. 23, 2011

(65) Prior Publication Data

US 2012/0058649 A1    Mar. 8, 2012

(30) Foreign Application Priority Data

Sep. 2, 2010   (JP) ................................. 2010-196388
Feb. 22, 2011  (JP) ................................. 2011-035664

(51) Int. Cl.
*H01L 27/14*    (2006.01)
*H01L 21/44*    (2006.01)

(52) U.S. Cl.
USPC .......................................... 257/428; 438/680

(58) Field of Classification Search
USPC ...................... 438/59–63, 680; 257/428, 607; 118/723 E, 725
See application file for complete search history.

(56) References Cited

U.S. PATENT DOCUMENTS 5,372,648 A *    12/1994    Yamamoto et al. ........ 118/723 E
2012/0325777 A1 *   12/2012    Okumura et al. ............... 216/68

FOREIGN PATENT DOCUMENTS

| JP | 4-284974 | 10/1992 |
| JP | 8-083696 | 3/1996 |
| JP | 8-118027 | 5/1996 |
| JP | 2001-068298 | 3/2001 |
| JP | 2002-500818 | 1/2002 |
| JP | 2007-287454 | 11/2007 |
| JP | 2008-053634 | 3/2008 |
| JP | 2009-158251 | 7/2009 |
| JP | 2009-545165 | 12/2009 |
| JP | 2010-539336 | 12/2010 |
| WO | 99/52333 | 10/1999 |
| WO | 2008/013942 | 1/2008 |
| WO | 2009/047442 | 4/2009 |

OTHER PUBLICATIONS

S. Higashi et al., "Crystallization of Si in Millisecond Time Domain Induced by Thermal Plasma Jet Irradiation", Japanese Journal of Applied Physics, vol. 45, No. 5B (2006), pp. 4313-4320.
Y. Tanaka et al., "Non-equilibrium in thermal plasma", Journal of Plasma Fusion Society, Col. 82, No. 8 (2006), pp. 479-483 (with partial English translation).

* cited by examiner

*Primary Examiner* — Calvin Lee
(74) *Attorney, Agent, or Firm* — Wenderoth, Lind & Ponack, L.L.P.

(57) ABSTRACT

In a plasma torch unit, copper rods forming a coil as a whole are disposed inside copper rod inserting holes formed in a quartz block so that the quartz block is cooled by water flowing inside the copper rod inserting holes and cooling water pipes. A plasma ejection port is formed on the lowermost portion of the torch unit. While a gas is being supplied into a space inside an elongated chamber, high-frequency power is supplied to the copper rods to generate plasma in the space inside the elongated chamber so that the plasma is applied to a substrate.

14 Claims, 25 Drawing Sheets

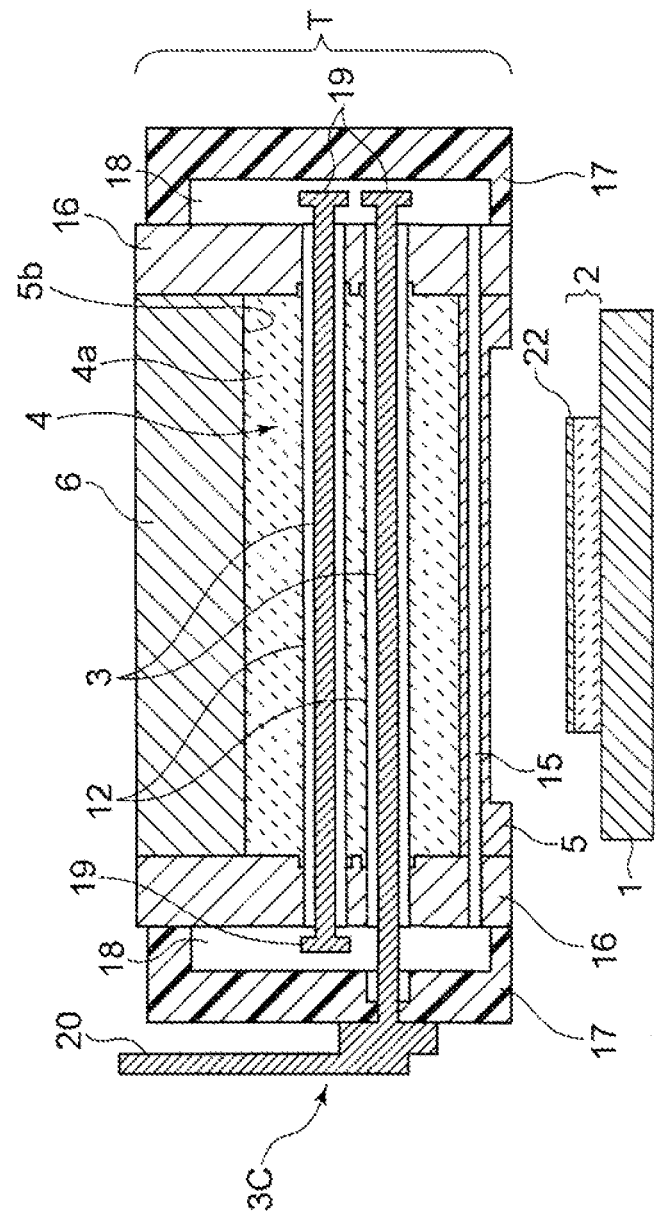

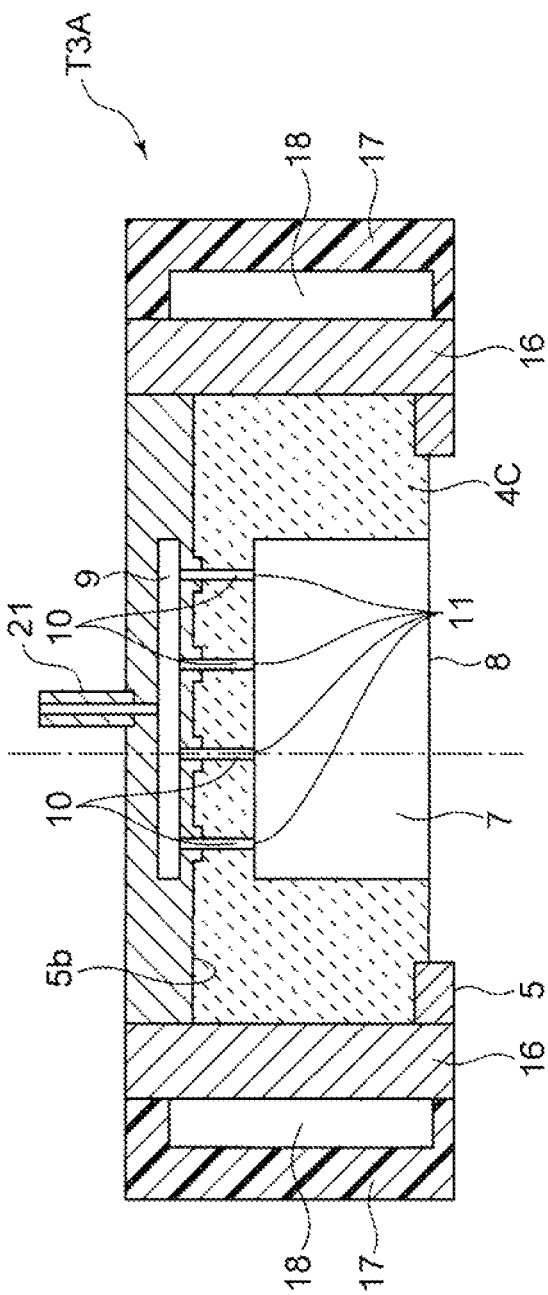
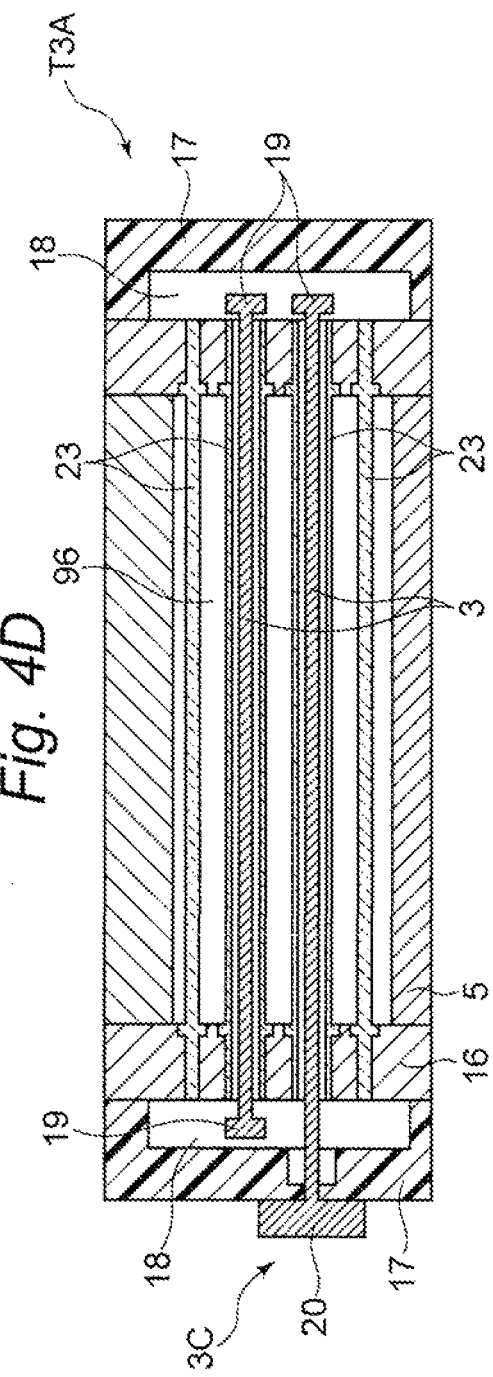
Fig. 4C
Fig. 4D

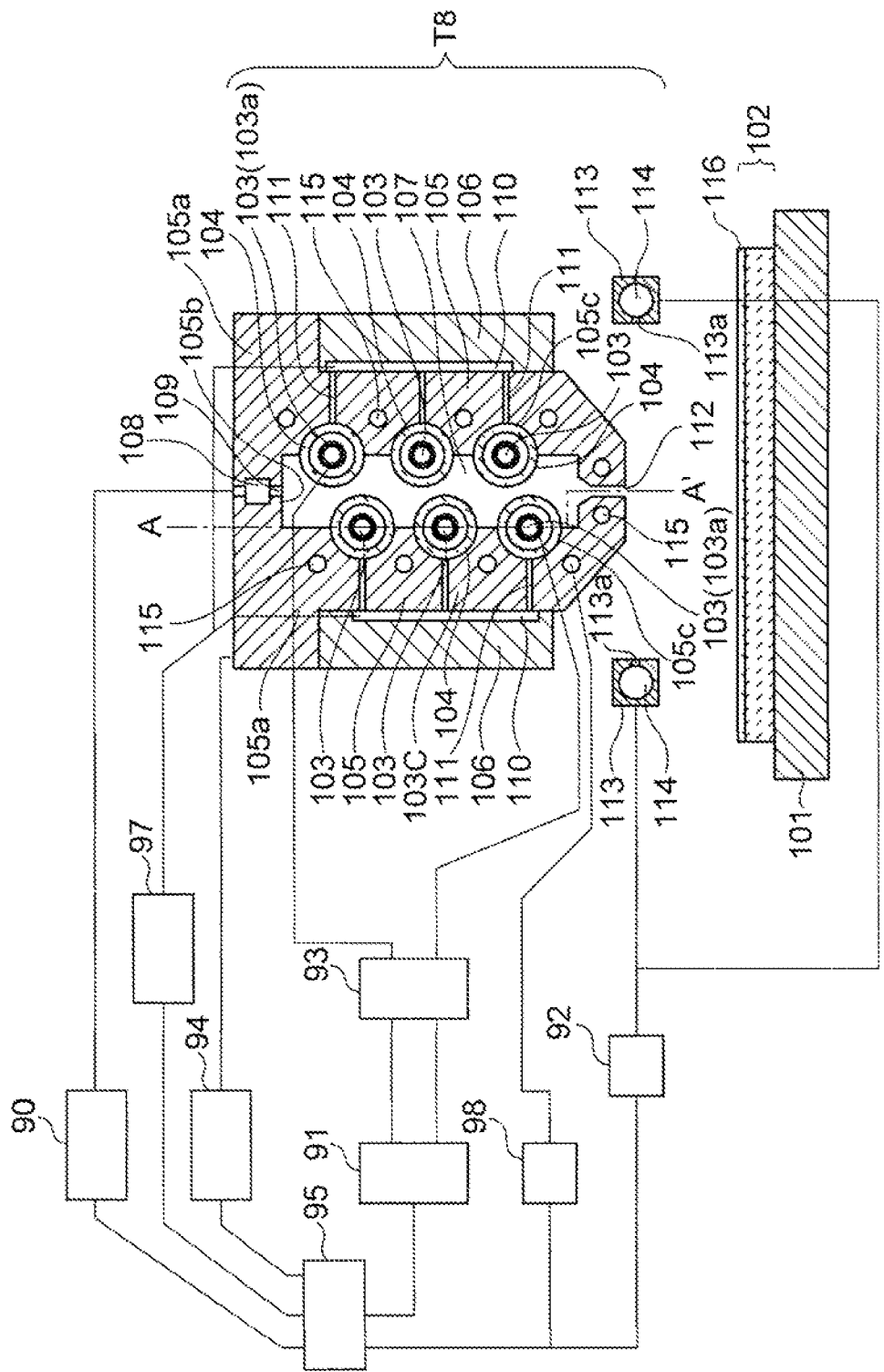

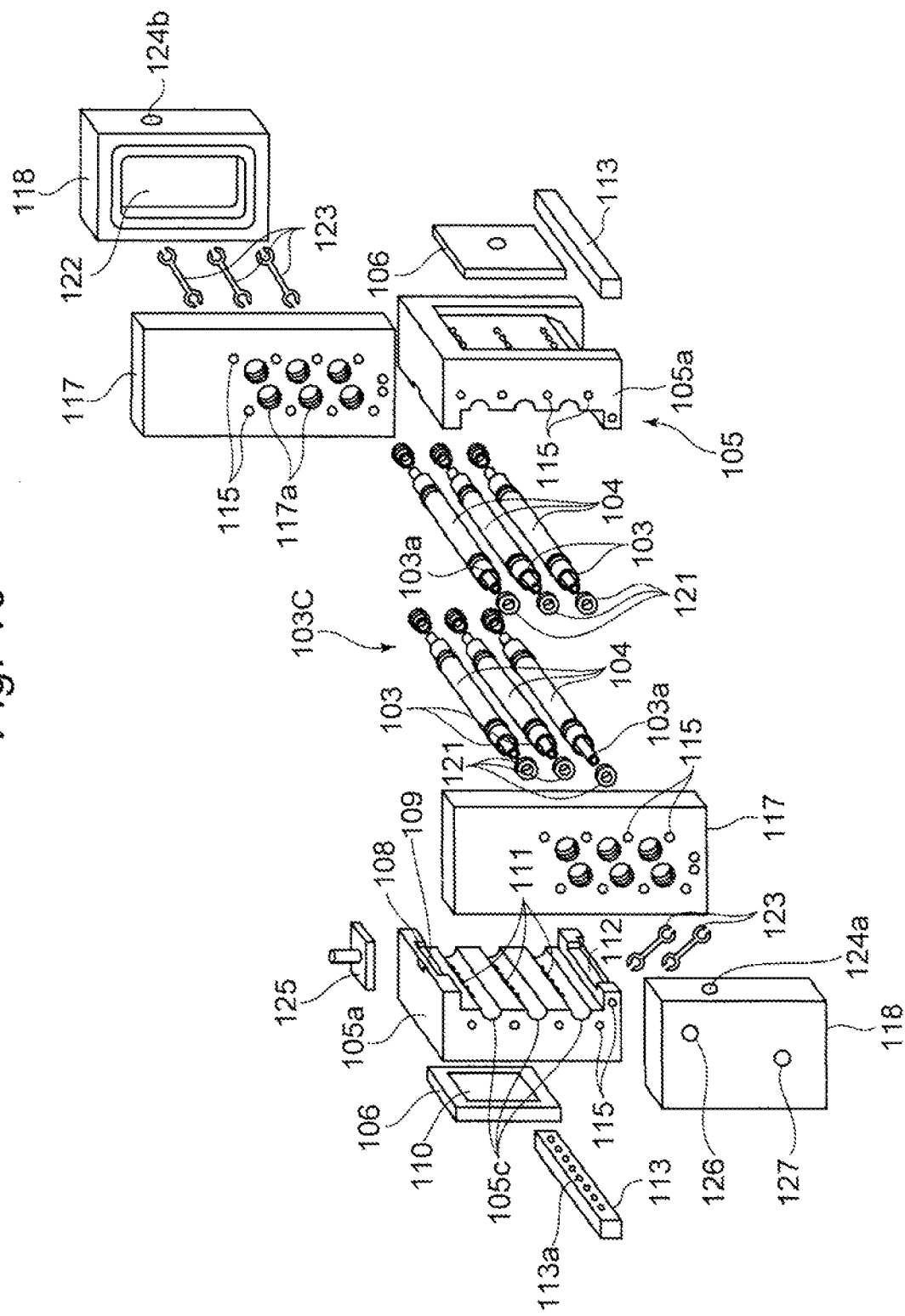

PLASMA PROCESSING APPARATUS AND METHOD THEREOF

BACKGROUND OF THE INVENTION

The present invention relates to thermal plasma processing for use in processing a substrate by applying thermal plasma onto the substrate, or a plasma processing apparatus and a method thereof, which applies plasma derived from a reaction gas or plasma and the reaction gas flow simultaneously onto a substrate so that plasma processing such as low-temperature plasma processing is carried out thereon.

Conventionally, a semiconductor thin film, such as polycrystalline silicon (poly-Si), has been widely utilized for thin-film transistors (TFT: Thin Film Transistor) or solar batteries. In particular, the poly-Si TFT has high carrier mobility, and is characterized in that it can be formed onto a transparent insulating substrate, such as a glass substrate. By utilizing this characteristic, the poly-Si TFT is widely used, for example, as switching elements forming a pixel circuit for a liquid display apparatus, a liquid crystal projector, or an organic EL display apparatus, or as a circuit element for a driver for driving liquid crystal.

As a method for manufacturing a high-performance TFT on a glass substrate, in general, a manufacturing method referred to as "high-temperature processing" is proposed. Among the manufacturing processes for a TFT, a process in which a high temperature of about 1000° C. is used as the highest temperature in the process is generally referred to as "high-temperature processing". The characteristics of the high-temperature processing are that a relatively high-quality polycrystalline silicon can be formed as a film by utilizing a solid-phase epitaxy of silicon, that a high-quality gate insulating layer can be obtained by thermal oxidation of silicon, and that a clean interface between polycrystalline silicon and a gate insulating layer can be obtained. By these characteristics, the high-temperature processing makes it possible to manufacture a high-performance TFT having high mobility and high reliability in a stable manner.

In contrast, since the high-temperature processing is a process in which a silicon film is crystallized by solid-phase epitaxy, heating treatment for a long period, such as 48 hours, at a temperature of about 600° C. is required. This process is requires an extremely long period, and in order to increase the throughput of the process, a large number of heating furnaces are inevitably required, resulting in an issue of difficulty in reducing costs. In addition, since quartz glass needs to be used as an insulating substrate having high heat resistance, the costs of substrates become higher, with the result that this method is not suitable for providing devices with large areas.

In contrast, a technique referred to as "low-temperature processing" has been proposed in which the highest temperature during the processes is lowered so that a poly-Si TFT is manufactured on an inexpensive glass substrate with a large surface area. Among manufacturing processes of TFTs, the process for manufacturing a poly-Si TFT on a relatively inexpensive heat-resistant glass substrate under a temperature environment having the highest temperature of about 600° C. or less is generally referred to as "low-temperature process". In the low-temperature process, a laser crystallization technique that crystallizes a silicon film by using a pulse laser whose oscillation time is very short has been widely used. The laser crystallization refers to a technique in which such a characteristic that the silicon thin film is instantaneously fused by irradiating a silicon thin film on a substrate with pulse laser light having high output and this fused silicon thin film is crystallized during its solidification is utilized.

However, this laser crystallization technique has some major issues. One of the issues is a large number of trap levels that are localized inside a polysilicon film formed by the laser crystallization technique. Due to the existence of these trap levels, carriers that are to be originally shifted through an active layer upon application of a voltage are trapped, failing to devote to electric conduction, with the result that adverse effects, such as a reduction in the mobility of TFTs and an increase of the threshold voltage, are raised. Another issue is that by the limitation of the laser output, the size of a glass substrate is limited. In order to improve the throughput of the laser crystallization process, it is necessary to increase the area that can be crystallized in one time. However, since the current laser output has limitations, upon application of this crystallization technique to a large-size substrate of the seventh generation (1800 mm×2100 mm), a long period of time is required for crystallizing one substrate.

Moreover, as the laser crystallization technique, in general, a laser that is formed into a line pattern is used, and the crystallization is performed by scanning this laser. Since this line beam has limitations in laser output, it is shorter than the width of a substrate, and it is necessary to carry cut the laser scanning process several times in a divided manner in order to crystallize the entire surface of the substrate. This generates joint regions of the line beam within the substrate, resulting in double scanned regions. The crystalline characteristic in these regions is greatly different from that in the region crystallized by the scanning of one time. For this reason, the element characteristics of the two regions are greatly different from each other and become the main cause of device deviations. Lastly, since the laser crystallization device has a complicated device structure, and sine the costs of consumable parts are high, there is an issue in that the device costs and running costs are consequently high. As a result, TFTs using a polysilicon film crystallized by using a laser crystallization device cause elements having high production costs.

In order to overcome these issues of the limitation of the substrate size and high device cost's, a crystallization technique called "thermal plasma jet crystallization method" has been examined (for example, see "Crystallization of Si in Millisecond Time Domain Induced by Thermal Jet Irradiation" S. Higashi, H. Kaku, T. Okada, H. Murakami, and S. Miyazaki, Japanese Journal of Applied Physics, Vol. 45, No. 5B, (2006) pp. 4313-4320). This technique is briefly described in the following. When a tungsten (W) cathode and a water-cooled copper (Cu) anode are made to face each other, and a DC voltage is applied thereto, an arc discharge is generated between the electrodes. By allowing an argon gas to flow between these electrodes under the atmospheric pressure, thermal plasma is ejected from an ejection hole opened in the copper anode. The thermal plasma is thermally equilibrium plasma forming an ultra-high temperature heat source in which temperatures of ions, electrons, and neutral atoms are almost the same, with the temperatures thereof being set to about 10000 K. For this reason, the thermal plasma can easily heat an object to be heated to a high temperature, and by scanning a substrate on which an a-Si film is deposited in front of the ultra-high temperature thermal plasma at a high speed, the a-Si film can be crystallized.

In this manner, since the device structure is very simple, and since the crystallization process is carried out under the atmospheric pressure, it is not necessary to cover the device with an expensive member, such as a chamber, and device costs are expected to be extremely low. Moreover, since utilities required for the crystallization are only an argon gas, power, and cooling water, this system provides a crystallization technique also having inexpensive running costs.

FIG. 20 is a schematic view that describes the crystallization method of a semiconductor film using this thermal plasma.

In FIG. 20, a thermal plasma generation device 31 includes a cathode 32, and an anode 33 that is placed with a predetermined distance apart from the cathode 32 so as to face therewith. The cathode 32 is made of a conductor such as, for example, tungsten. The anode 33 is made of a conductor such as, for example, copper. Moreover, the anode 33 is formed into a hollow structure so as to be cooled with water being allowed to pass through the hollow portion. Furthermore, an ejection hole (nozzle) 34 is formed in the anode 33. Upon application of a direct current (DC) voltage between the cathode 32 and the anode 33, an arc discharge is generated therebetween. By allowing a gas such as an argon gas to flow between the cathode 32 and the anode 33 under the atmospheric pressure in this state, thermal plasma 35 can be ejected from the ejection hole 34. In this case, "thermal plasma" is the thermally equilibrium plasma forming an ultra-high temperature heat source in which temperatures of ions, electrons, and neutral atoms are almost the same, with the temperatures thereof being set to about 10000 K.

Such thermal plasma 35 can be utilized for heating treatment for use in crystallization of a semiconductor film.

More specifically, a semiconductor film 37 (for example, amorphous silicon film) is preliminary formed on a substrate 36, and the thermal plasma (thermal plasma jet) 35 is applied to the semiconductor film 37. At this time, the thermal plasma 35 is applied to the semiconductor film 37, while being relatively shifted along a first axis (lateral direction in an example of FIG. 20) in parallel with the surface of the semiconductor film 37. That is, the thermal plasma 35 is applied to the semiconductor film 37, while being scanned in the first axis direction. In this case, "being relatively shifted" means that the semiconductor film 37 (and a substrate 36 supporting the semiconductor film 37) and the thermal plasma 35 are relatively shifted, and includes both cases in which only one of these is shifted and in which both of them are shifted together. By carrying out such a scanning process of the thermal plasma 35, the semiconductor film 37 is heated by a high temperature of the thermal plasma 35 to obtain a crystallized semiconductor film 38 (polysilicon film in this example) (for example, see Japanese Unexamined Patent Publication No. 2008-53634).

FIG. 21 is a conceptual view showing a relationship between the depth from the uppermost surface and the temperature. As shown in FIG. 21, by shifting the thermal plasma 35 over the substrate 36 at a high speed, only the proximity of the surface of the substrate 36 can be treated at a high temperature. Since the heated region is quickly cooled after the thermal plasma 35 has passed, the temperature on the proximity of the surface becomes high only for a very short period of time.

The thermal plasma 33 is generally generated in dot regions. Since the thermal plasma 35 is maintained by thermions discharged from the cathode 32 and the thermions are more vigorously discharged at a position having high plasma density, a positive feedback is exerted so that the plasma density becomes increasingly higher. That is, the arc discharge occurs by concentrating on one point of the cathode so that the thermal plasma 35 is generated at the dot region.

In the case where an attempt is made so as to uniformly process a flat-shaped substrate, such as in the case of crystallization of a semiconductor film, a dot-shaped thermal plasma needs to be scanned over the entire substrate. In this case, so as to provide a process that can be carried out in a short period of time by reducing the number of scanning operations, it is effective to increase a region irradiated with thermal plasma. For this reason, a technique for generating thermal plasma within a large area has long been examined.

For example, a method is disclosed in which, in a plasma jet ejected from an external nozzle of a plasma torch, width-widening gases for use in width-widening the plasma jet in a direction intersecting with the center axis of the external nozzle are ejected simultaneously from two portions so that the plasma jet is widened (for example, see Japanese Unexamined Patent Publication No. 08-118027). Alternatively, another, method is proposed in which a plasma nozzle, which is characterized in that its mouth of the nozzle passage is tilted with a predetermined angle relative to the axis center of the nozzle passage, is prepared, and a casing that forms the nozzle passage, or one portion of such a casing, is rotated at a high speed around the longitudinal axis center so that the plasma nozzle is allowed to pass and shift along a work piece (for example, see Japanese Unexamined Patent Publication No. 2001-68298). Moreover, a system is disclosed in which a rotation head having at least one plasma nozzle disposed in an eccentric manner is provided (for example, see Japanese Unexamined Patent Publication No. 2002-500818).

Additionally, although not intended to process a large area in a short period of time, a high-speed gas shield arc welding method is disclosed in which, as a welding method utilizing the thermal plasma, a band-shaped electrode is used, and a welding process is carried out with its width direction being coincident with the welding line direction (for example, see Japanese Unexamined Patent Publication No. 04-284974).

Moreover, there is disclosed an inductive coupling-type plasma torch having a linear elongated shape, which uses an insulator member having a flat rectangular parallel epiped shape (for example, see Japanese Unexamined Patent Publication No. 2009-545165).

Additionally, a method for generating elongated linear plasma by using an elongated electrode is proposed (for example, see Japanese Unexamined Patent Publication No. 2007-287454). Although this system is described as a method for generating thermal plasma, this system relates to generation of low-temperature plasma, and is not suitable for thermal treatment. Supposing that this is used for generating thermal plasma, the arc discharge is concentrated on one portion because this system is a capacitive coupling-type using electrodes, and it is considered to be difficult to generate thermal plasma that is uniform in the longitudinal direction. In contrast, as a low-temperature plasma processing apparatus, this system provides a device capable of carrying out plasma processing, such as etching or film-forming, by forming an etching gas or a CVD (Chemical Vapor Deposition) gas into plasma.

Moreover, a system is disclosed in which a linear elongated plasma torch is formed by aligning a plurality of discharging electrodes into a line pattern (for example, see Japanese Unexamined Patent Publication No. 2009-158251).

However, the conventional technique for generating thermal plasma on a large area is not effectively applied to high-temperature treatment on the proximity of a surface of a substrate only in a very short period of time, such as a crystallizing process of a semiconductor.

In the technique for generating thermal plasma on a large area, described in Japanese Unexamined Patent Publication No. 08-118027 shown in the conventional examples, although the region is widened, the temperature distribution in the widened region becomes 100° C. or more, making it impossible to realize uniform thermal treatment.

Moreover, in the techniques for generating thermal plasma on a large area described in Japanese Unexamined Patent Publication Nos. 2001-68298 and 2002-500818 shown in the conventional examples, since the thermal plasma is inherently rocked, the period of time during which the thermal treatment is actually carried out becomes shorter than that of the scanning process without rotation, with the result that the period of time during which the large area is processed in not particularly shortened. Moreover, in order to carry out a uniform process, the rotation speed needs to be sufficiently made higher as compared with the scanning speed, inevitably causing a complicated structure of a nozzle.

Moreover, the technique described in Japanese Unexamined Patent Publication No. 04-284974 shown in the conventional examples is a welding technique, and is not a structure for processing a large area uniformly. Even in an attempt to apply this technique to the processing for a large area, since the dot-shaped arc oscillates along the belt-shaped electrode in this structure, nonuniform plasma is instantaneously caused although the plasma is uniformly generated on a time-averaged basis. Therefore, this technique is not applicable to the uniform processing for a large area.

Furthermore, the technique described in Japanese Unexamined Patent Publication No. 2009-545165 shown in the conventional examples is different from the structure using a DC arc discharge disclosed in "Crystallization of Si in Millisecond Time Domain. Induced by Thermal Jet Irradiation" S. Higashi, H. Kaku, T. Okada, H. Murakami, and S. Miyazaki, Japanese Journal of Applied Physics, Vol. 45, No. 5B, (2006) pp. 4313-4320 and Japanese Unexamined Patent Publication No. 2008-53634, and is characterized in that an inductive coupling-type high-frequency plasma torch is utilized. Since this is an electrodeless discharging process, there is an advantage that thermal plasma with superior stability is obtained (with small time-based fluctuations) and the electrode materials are hardly mixed into the substrate (contamination).

In the inductive coupling-type plasma torch, in general, a method has been adopted in which, in order to protect the insulator material from high-temperature plasma, the insulator material is formed into a double-tube structure with a coolant being allowed to flow therebetween. However, in the technique described in Japanese Unexamined Patent Publication No. 2009-545165 shown in the conventional examples, since an insulator material has a flat rectangular parallelepiped shape, it is not possible to flow a coolant with a sufficient flow rate by simply forming the insulator material into a double-tube structure. The reason for this is because, since the insulator material is generally inferior in mechanical strength to metals, the inner pressure in the double tubes cannot be made higher if the insulator material is made too long in the longitudinal direction. Consequently, it has limitations in processing a large area uniformly.

Although there is assumed to be no issue with cooling in the insulator material, in the technique described in Japanese Unexamined Patent Publication No. 2009-545165 shown in the conventional examples, since the high-temperature plasma formed in the inner space of the insulator material is such that only one portion thereof ejected from its lowermost portion, is directly reacted with the substrate, there is an issue in that power efficiency is poor. Moreover, in the inner space of the insulator material, since the plasma density near the center becomes higher, the plasma becomes nonuniform in the longitudinal direction, resulting in an issue in which the substrate is not processed uniformly.

Additionally, even in the case of a dot-shaped thermal plasma, since the number of scanning times can be reduced upon processing a large area if the diameter of the thermal plasma is large, a process in a short period of time can be achieved depending on applications. However, when the diameter of the thermal plasma is large, since the time during which the thermal plasma passes over the substrate upon scanning becomes substantially longer, it is not possible to carry out a high-temperature process only on the proximity of the surface of the substrate only for a short period of time. Therefore, a rather deeper region in the substrate becomes a high temperature to sometimes cause issues such as, for example, cracks in the glass substrate and film separations.

Moreover, in the technique described in Japanese Unexamined Patent Publication No. 2009-158251 shown in the conventional examples, as compared with the above-mentioned inductive coupling-type high-frequency plasma torch, there are disadvantages in that stability in thermal plasma is poor (time-based fluctuations are large) and the electrode materials tend to be mixed into the substrate (contamination).

SUMMARY OF THE INVENTION

The present invention has been devised in order to solve the above issues, and an object thereof is to provide a plasma processing apparatus and a method thereof, which, upon carrying out high-temperature thermal treatment uniformly on the proximity of a surface of a substrate for only a very short period of time, or upon applying plasma derived from a reaction gas or plasma and a reaction gas flow simultaneously onto a substrate so as to carryout low-temperature plasma processing, makes it possible to process the entire desired processing area of the substrate in a short period of time.

In order to achieve the above object, the present invention has the following structures.

According to a first aspect of the present invention, there is provided a plasma processing apparatus comprising:

a case having a chamber that communicates with an opening having a slit shape, and is surrounded by a dielectric member;

a gas supply device for supplying a gas to the chamber through a gas introducing port;

a conductive unit that is disposed in a manner so as to bridge over the chamber in the case and generates a high-frequency electromagnetic field in the chamber;

a high-frequency power supply that supplies high-frequency power to the conductive unit; and a substrate mounting base on which a substrate is mounted, and which is disposed so as to face the opening, wherein a longitudinal direction of the chamber and a longitudinal direction of the opening are disposed in parallel with each other, and the conductive unit is formed by electrically connecting a plurality of conductor members that are disposed in parallel with the longitudinal direction of the chamber, with the chamber being sandwiched therebetween.

With this arrangement, upon carrying out high-temperature thermal treatment uniformly on the proximity of a surface of the substrate for only a very short period of time, or upon applying plasma derived from a reaction gas or plasma and a reaction gas flow simultaneously onto the substrate so as to carry out low-temperature plasma processing, it becomes possible to realize plasma processing that can process the entire desired processing area of the substrate in a short period of time. Moreover, a plurality of the conductor members are prepared, and by electrically connecting the conductor members with one another at end portions thereof so as to form, for example, a coil as the entire conductive unit, it becomes possible to generate plasma with higher efficiency.

According to a second aspect of the present invention, there is provided the plasma processing apparatus according to the first aspect, wherein each of the conductor members is surrounded by a dielectric member, and one portion of the dielectric member surrounding the conductor members is disposed to be exposed to a space inside the chamber.

According to a third aspect of the present invention, there is provided the plasma processing apparatus according to the first aspect, further comprising:

a shifting device that allows the chamber and the substrate mounting base to shift relative to each other in a direction perpendicular to the longitudinal direction of the opening.

With this arrangement, it becomes possible to protect the outer wall surface of the dielectric tube by using a mall gas flow rate.

According to a fourth aspect of the present invention, there is provided the plasma processing apparatus according to the third aspect, wherein one portion of an inner wall of the chamber is made of a conductor block, and a dielectric tube is fitted to a fitting concave portion for the dielectric tube, formed in the conductor block, and a gas introducing passage for introducing a gas into the chamber through a gap between the concave portion of the conductor block and the dielectric tube is formed in the case, and a dielectric tube protective gas supply device for supplying a dielectric tube protective gas to the gas introducing passage is further installed.

With this arrangement, it becomes possible to protect the outer wall surface of the dielectric tube by using a smaller gas flow rate.

According to a fifth aspect of the present invention, there is provided the plasma processing apparatus according to the third aspect, further comprising:

a shield gas supply member having a shield gas introducing port for supplying a shield gas, the shield gas supply member that is placed in parallel with the longitudinal direction of the opening, in a separate manner from the gas introducing port, and formed on a surface opposed to the opening; and a shield gas supply device for supplying the shield gas from the shield gas introducing port.

With this arrangement, it becomes possible to enhance controllability of plasma.

In the plasma processing apparatus, preferably, by allowing a coolant to flow through a space between the outer wall surface of each conductor rod and the inner wall surface of each dielectric tube, the conductor rod and the dielectric tube are desirably cooled.

With this arrangement, further high-temperature plasma can be stably generated.

According to a sixth aspect of the present invention, there is provided the plasma processing apparatus according to the first aspect, wherein the conductor member has a hollow tube shape, and a coolant is allowed to flow through an inner space defined by a tube formed by the conductor member so that the conductor member is cooled.

With this arrangement, further high-temperature plasma can be stably generated.

According to a seventh aspect of the present invention, there is provided the plasma processing apparatus according to the first aspect, wherein the case is formed by surrounding a periphery of the dielectric member with a conductor.

With this arrangement, a high-frequency leakage can be effectively prevented.

According to an eighth aspect of the present invention, there is provided the plasma processing apparatus according to the first aspect, wherein a dielectric block is placed in the case, with the conductor member being installed in an elongated hole of the dielectric block formed near the chamber, in parallel with the chamber so that the respective conductor members are surrounded by the dielectric member.

With this arrangement, upon carrying out high-temperature thermal treatment uniformly on the proximity of a surface of the substrate for only a very short period of time, or upon applying plasma derived from a reaction gas or plasma and a reaction gas flow simultaneously onto the substrate so as to carry out low-temperature plasma processing, it becomes possible to process the entire desired processing area of the substrate in a short period of time.

According to a ninth aspect of the present invention, there is provided the plasma processing apparatus according to the eighth aspect, wherein, on a cross-section taken along a plane perpendicular to the longitudinal direction, that includes the chamber, a shortest distance from the conductor member to each of the a conductor other than the conductor member is set to be longer than a shortest distance from the conductor member to the chamber.

With this arrangement, it becomes possible to generate plasma with higher efficiency.

According to a tenth aspect of the present invention, there is provided the plasma processing apparatus according to the eighth aspect, wherein the chamber surrounded by the dielectric member is prepared as a slit formed in the dielectric block, with the elongated hole being formed near the slit of the dielectric block.

With this arrangement, it becomes possible to manufacture a plasma processing apparatus by using a smaller number of parts.

According to an 11th aspect of the present invention, there is provided the plasma processing apparatus according to the eighth aspect, wherein the high-frequency power supply supplies the high-frequency power to the plurality of conductor members that are made to face each other with the chamber interposed therebetween, so as to allow high-frequency currents with reversed phases to flow through the plurality of conductor members that are made to face each other with the chamber interposed therebetween.

According to a 12th aspect of the present invention, there is provided the plasma processing apparatus according to the eighth aspect, wherein, among the plurality of conductor members, the high-frequency power supply supplies the high-frequency power to the plurality of conductor members that are made to face each other with the chamber interposed therebetween, so as to allow high-frequency currents with the same phase to flow through the conductor members that are made to face each other with the chamber interposed therebetween.

According to a 13th aspect of the present invention, there is provided the plasma processing apparatus according to the eighth aspect, wherein the elongated hole is designed to function as a coolant passage that allows a coolant to flow therethrough.

With this arrangement, it becomes possible to achieve an effective cooling process of the plasma processing apparatus.

Preferably, in a separated manner from the elongated hole, an elongated coolant passage that is in parallel with the elongated hole is formed in the dielectric block.

With this arrangement, it becomes possible to achieve an effective cooling process of the plasma processing apparatus.

Preferably, the elongated hole and the elongated coolant passage are desirably allowed to communicate with two coolant manifolds formed on the two sides in the longitudinal direction of the elongated chamber.

With this arrangement, it becomes possible to achieve a plasma processing apparatus having a smaller size and a simpler structure.

According to a 14th aspect of the present invention, there is provided the plasma processing apparatus according to the eighth aspect, wherein a space is formed between the case that is grounded and the dielectric block, and the space is filled with an abnormal discharge preventive gas.

With this arrangement, it becomes possible to suppress an abnormal discharge. Moreover, a lightweight plasma processing apparatus can be achieved.

The elongated hole may be prepared as a cylindrical pipe made of a dielectric material.

With this arrangement, it becomes possible to achieve a more inexpensive plasma processing apparatus.

Preferably, the elongated chamber is made of a gap between a plurality of dielectric cylindrical pipes that are bundled.

With this arrangement, a further inexpensive plasma processing apparatus can be achieved.

The width in a direction perpendicular to the longitudinal direction of the elongated chamber may be wider than the width in a direction perpendicular to the longitudinal direction of the opening portion.

With this arrangement, it is possible to realize a stable plasma processing operation.

According to a 15th aspect of the present invention, there is provided a plasma processing method comprising:

supplying a gas through a gas introducing port into a chamber that is installed in a case, and surrounded by a dielectric member, ejecting the gas from a slit-shaped opening toward a substrate, the slit-shaped opening being formed in the chamber and having the longitudinal direction thereof in parallel with the longitudinal direction of the chamber, and supplying high-frequency power to a conductive unit that is electrically connected to a plurality of conductor members that are installed in the case, and disposed in parallel with the longitudinal direction of the chamber with the chamber interposed there between, in a manner so as to bridge over the chamber, to generate a high-frequency electromagnetic field in the chamber so that plasma is generated in the chamber supplied with the gas; and processing a surface of the substrate, while shifting the chamber and the substrate in a direction perpendicular to the longitudinal direction of the opening, relative to each other.

With this arrangement, upon carrying out high-temperature thermal treatment uniformly on the proximity of a surface of the substrate for only a very short period of time, or upon applying plasma derived from a reaction gas or plasma and a reaction gas flow simultaneously onto the substrate so as to carry out low-temperature plasma processing, it becomes possible to provide plasma processing that can process the entire desired processing area of the substrate in a short period of time.

According to a 16th aspect of the present invention, there is provided the plasma processing method according to the 15th aspect, further comprising:

in a state where a dielectric block is placed in the case, with the conductor members being placed inside an elongated hole of the dielectric block that is formed near the chamber in parallel with the chamber, so that the respective conductor members are surrounded by the dielectric member, supplying the high-frequency power to the conductive unit to generate the high-frequency electromagnetic field in the chamber and to generate the plasma in the chamber supplied with the gas.

With this arrangement, upon carrying out high-temperature thermal treatment uniformly on the proximity of a surface of the substrate for only a very short period of time, or upon applying plasma derived from a reaction gas or plasma and a reaction gas flow simultaneously onto the substrate so as to carry out low-temperature plasma processing, it becomes possible to process the entire desired processing area of the substrate in a short period of time.

In accordance with the present invention, it is possible to achieve plasma processing which can process the entire desired processing area of the substrate in a short period of time, upon carrying out high-temperature thermal treatment uniformly on the proximity of a surface of the substrate for only a very short period of time, or upon applying plasma derived from a reaction gas or plasma and a reaction gas flow simultaneously onto the substrate so as to carry out low-temperature plasma processing.

BRIEF DESCRIPTION OF THE DRAWINGS

These and other aspects and features of the present invention will become clear from the following description taken in conjunction with the preferred embodiments thereof with reference to the accompanying drawings, in which:

FIG. 1C is a cross-sectional view (cross-sectional view taken along broken line B-B' of FIG. 1A) taken along a plane perpendicular to a substrate in parallel with the longitudinal direction of an inductive coupling-type plasma torch unit of one example of the plasma processing apparatus according to the first embodiment of the present invention;

FIG. 4C is a cross-sectional view (cross-sectional view taken along broken line A-A' of FIG. 1A) taken along a plane perpendicular to a substrate in parallel with the longitudinal direction of an inductive coupling-type plasma torch unit of one example of the plasma processing apparatus according to the modified example of the third embodiment of the present invention;

FIG. 4D is a cross-sectional view (cross-sectional view taken along broken line B-B' of FIG. 1A) taken along a plane perpendicular to a substrate in parallel with the longitudinal direction of an inductive coupling-type plasma torch unit of one example of the plasma processing apparatus according to the modified example of the third embodiment of the present invention;

FIG. 9A is a cross-sectional view showing a structure of a plasma processing apparatus according to an eighth embodiment of the present invention;

FIG. 10 is a perspective view showing the structure of the plasma processing apparatus according to the eighth embodiment of the -present invention;

DETAILED DESCRIPTION OF PREFERRED EMBODIMENTS

Figure 1A:
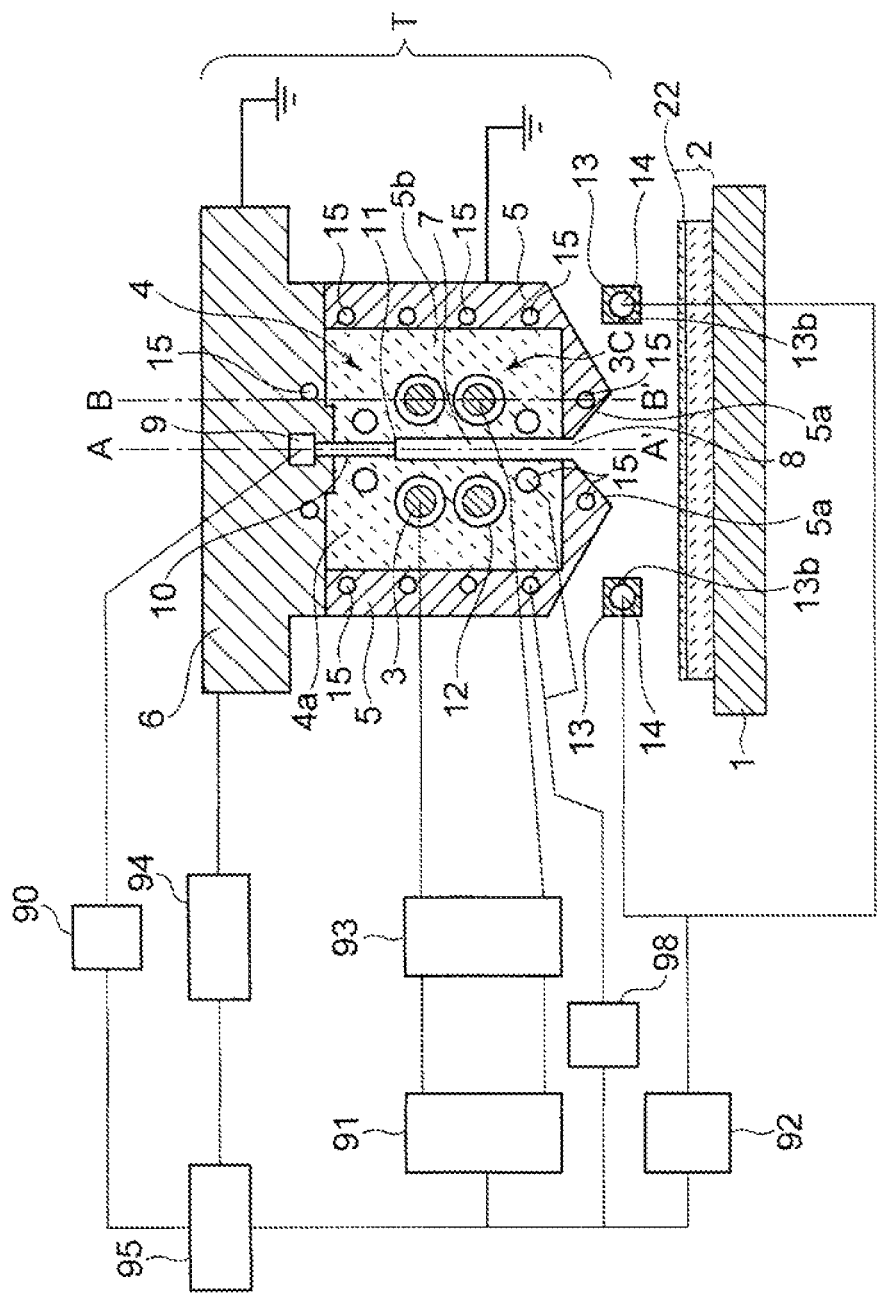
FIG. 1A is a cross-sectional view showing a structure of a plasma processing apparatus according to a first embodiment of the present invention.

Before continuing the description of the present invention, it is to be noted that like parts are denoted with like reference numerals throughout the accompanying drawings.

Hereinafter, plasma processing apparatuses and methods thereof according to embodiments of the present invention will be described with reference to the drawings.

(First Embodiment)

A first embodiment of the present invention will be described below with reference to FIGS. 1A to 2.

Figure 1B:
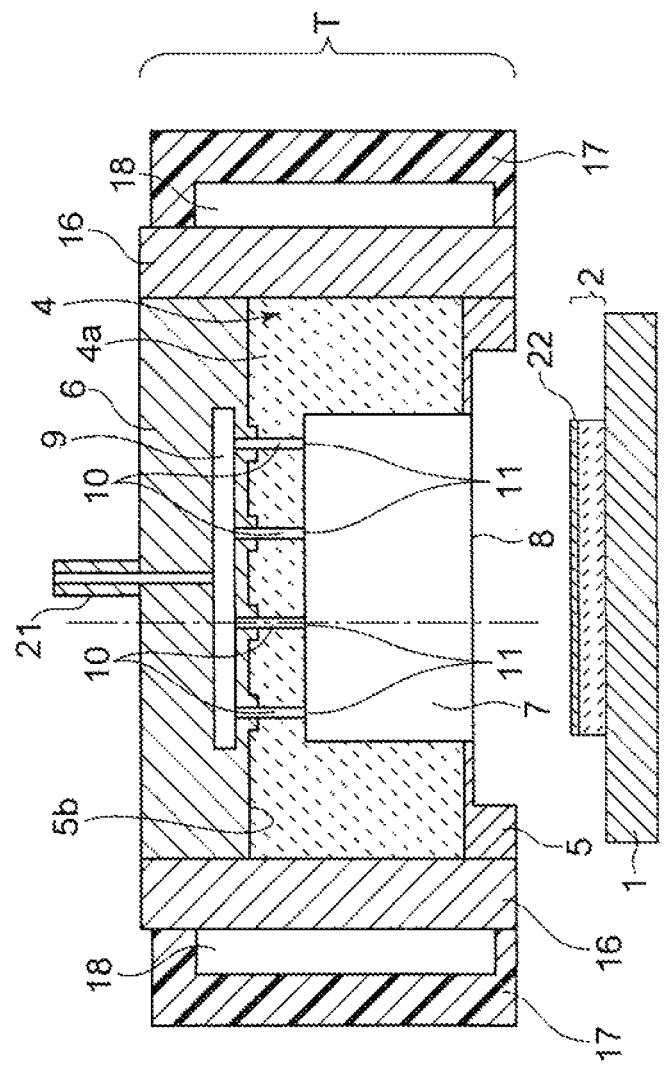
FIG. 1B is a cross-sectional view (cross-sectional view taken along broken line A-A' of FIG. 1A) taken along a plane perpendicular to the substrate in parallel with the longitudinal direction of the inductive coupling-type plasma torch unit of one example of the plasma processing apparatus according to the first embodiment of the present invention.
Figure 1D:
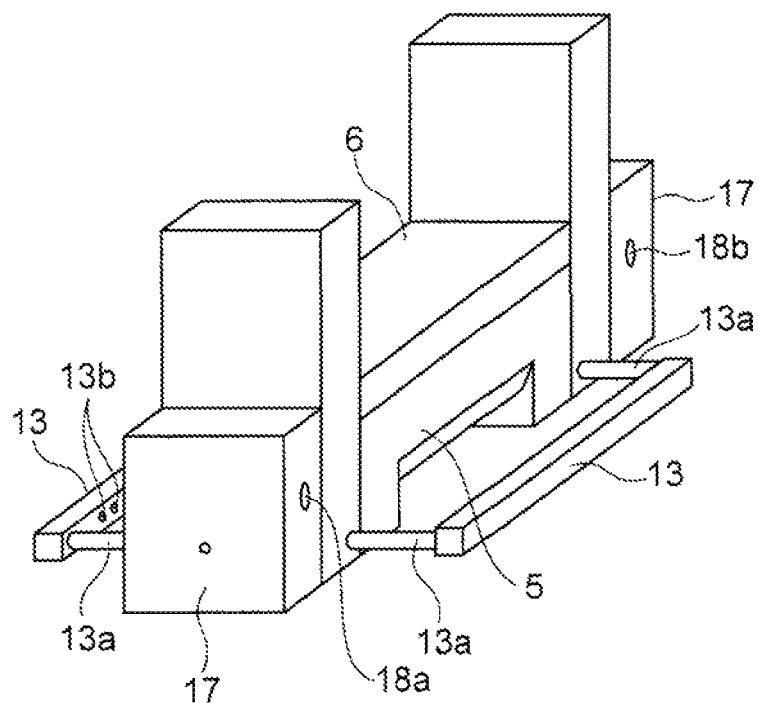
FIG. 1D is a perspective view of the inductive coupling-type plasma torch unit of one example of the plasma processing apparatus according to the first embodiment of the present invention.

FIG. 1A shows a structure of a plasma processing apparatus according to the first embodiment of the present invention, and is a cross-sectional view of an inductive coupling-type plasma torch unit T serving as one example of a plasma processing apparatus, taken along a plane perpendicular to the longitudinal direction thereof. Each of FIGS. 1B and 1C is a cross-sectional view taken along a plane perpendicular to a substrate 2 and in parallel with the longitudinal direction of the inductive coupling-type plasma torch unit T. FIG. 1B is a cross-sectional view taken along a broken line A-A' of FIG. 1A, and FIG. 1C is a cross-sectional view taken along a broken line B-B' of FIG. 1A. Moreover, FIG. 1A is a cross-sectional view taken along the broken line of FIG. 1B. Furthermore, FIG. 1D is a perspective view of the inductive coupling-type plasma torch unit T.

Figure 2:
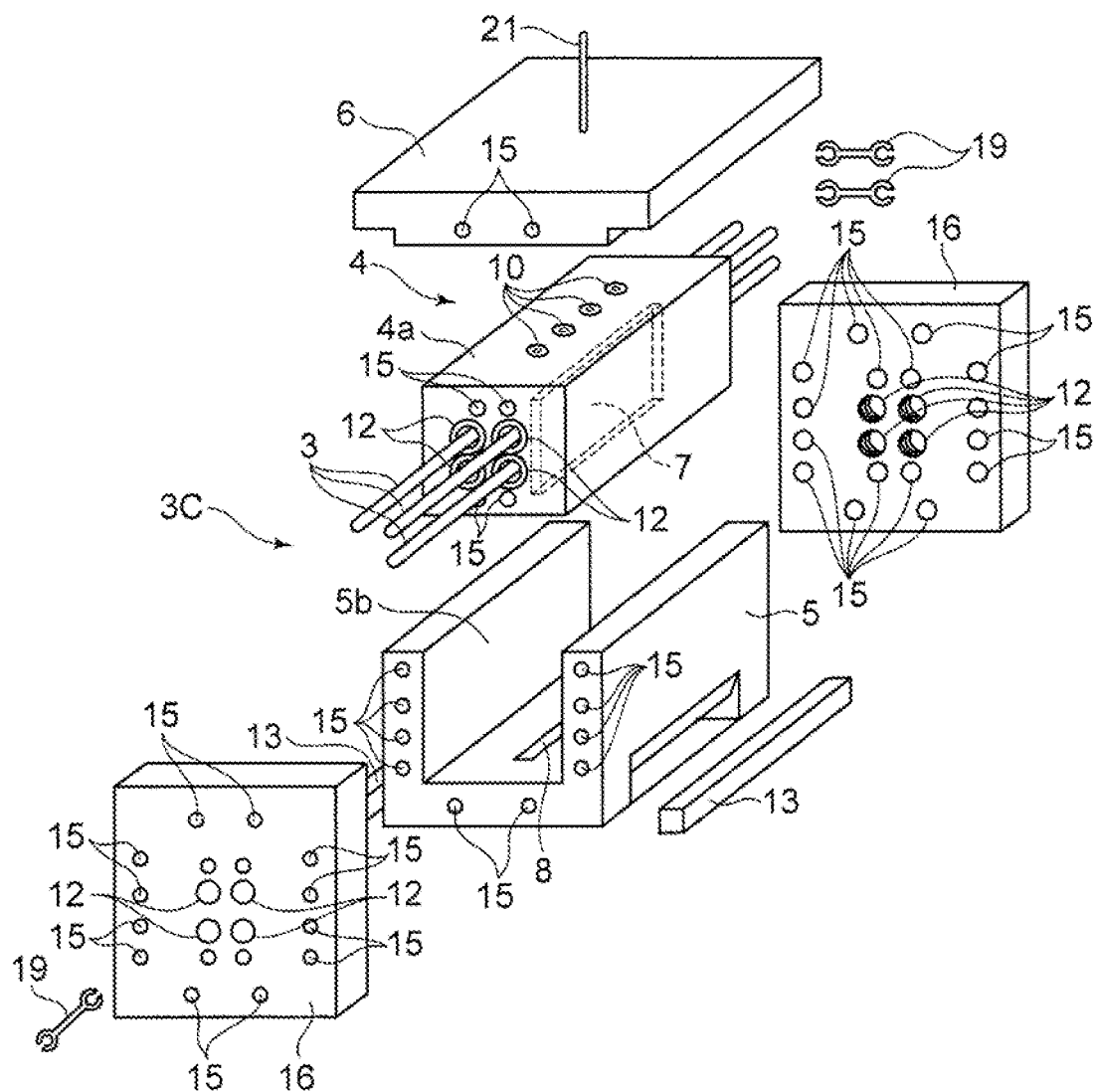
FIG. 2 is a perspective view showing a structure of the plasma processing apparatus according to the first embodiment of the present invention.

FIG. 2 is a view showing an assembly structure of the inductive coupling-type plasma torch unit T shown in FIGS. 1A to 1D, which includes perspective views of respective parts (one portion) that are placed side by side. The inductive coupling-type plasma torch unit T is provided with a brass block 5, a quartz block 4 serving as one example of a dielectric block, a gas supply device 90, a conductor rod 3 serving as one example of a conductor member, a high-frequency power supply 91, and a substrate mounting base 1, and may be further provided with a shield gas supply device 92 and a shifting device 94. The brass block 5 functions as one example-of a case or a device main-body block in combination with a brass lid 6, which will be described later.

In FIGS. 1A to 2, a substrate 2 is mounted on the substrate mounting base 1. In the inductive coupling-type plasma torch unit T, the quartz block 4, which is formed by a single square pillar member 4a made of a dielectric material, is provided with an elongated chamber 7 formed in an intermediate portion in the center in the width direction orthogonal to the longitudinal direction of the square pillar member 4a, except for the two ends thereof in the longitudinal direction, as a recessed section that extends in the longitudinal direction, and recessed upward from its lower end opening. Two pairs of large through holes 12 are formed in the square pillar member 4a with the elongated chamber 7 sandwiched therebetween, and in each of these through holes 12, a copper rod 3 serving as one example of a conductive rod forming one portion of a coil serving as one example of a conductive unit is inserted to be placed therein. Consequently, the copper rods 3 are disposed in the inner portions of the quartz block 4 that forms the elongated chamber 7 made of a dielectric member. The quartz block 4 is housed in a portion that is surrounded by: the brass block 5 having a concave portion 5b that is formed on the periphery of the quartz block 4 (that is, on the two side faces, the bottom face, and the two end faces, except for the upper face) and allowed to surround the quartz block 4; and a rectangular plate-shaped brass lid 6 that covers the opening on the upper face of the brass block 5. Since the brass block 5 and the brass lid 6 are grounded, a high-frequency leakage (noise) can be effectively prevented, and an undesirable abnormal discharge or the like can also be effectively prevented.

The inner space of the elongated chamber 7 forms an elongated slit that is formed in the quartz block 4 with a rectangular shape in its longitudinal cross-section, and is elongated in the longitudinal direction of the quartz block 4.

In other words, in this structure, the elongated chamber 7 is surrounded by the dielectric member. The plasma, generated in the space inside the elongated chamber 7, is ejected downward toward the substrate 2 through a plasma ejection port 8 serving as one example of an opening having a slit shape in the elongated chamber 7. In this case, the longitudinal direction of the elongated chamber 7 and the longitudinal direction of the plasma ejection port 8 are disposed in parallel with each other. The plasma ejection port 8 is an opening having the same size as the lower end opening of the elongated chamber 7 of the quartz block 4, and formed on the lower end portion of the brass block 5.

A plasma gas manifold 9, which extends in the longitudinal direction of the brass lid 6, is formed near the upper surface in the center of the quartz block 4 of the lower portion of the brass lid 6. To the center portion in the longitudinal direction of the plasma gas manifold 9, a plasma gas supply pipe 21 is connected from above the brass lid 6 so that a plasma gas can be supplied from the plasma gas supply device 90 into the plasma gas manifold 9 through the plasma gas supply pipe 21. Moreover, a plurality of plasma gas supply pipes 10 that connect the plasma gas manifold 9 with the elongated chamber 7 are formed along a vertical direction orthogonal to the longitudinal direction of the quartz block 4 so as to penetrate the quartz block 4, for example, with predetermined intervals from each other. An opening on the lower end of each of the plasma gas supply pipes 10 that faces the elongated chamber 7 functions as a plasma gas supply hole 11 serving as one example of a gas introducing port. Thus, a gas, supplied into the plasma gas manifold 9, is introduced into the space inside the elongated chamber 7 from the plasma gas supply hole 11 formed in the quartz block 4 through the plasma gas supply pipes 10 made of the through holes formed in the quartz block 4. Since the plasma gas supply pipes 10 are formed in a plurality of portions of the quartz block 4 in the longitudinal direction, desirably with predetermined intervals from one another, a uniform gas flow can be easily formed in the longitudinal direction of the quartz block 4.

Four copper rods 3 are installed, with the respective end portions of the copper rods 3 being electrically connected to one another, so that a coil 3C is formed as a whole. For example, one end of the copper rod 3 on the upper left of FIG. 1A (right end of FIG. 1C) and one end of the copper rod 3 on the upper right (right end of FIG. 1C) are electrically connected with each other through a conductive coupler (connector) 19 that forms one portion of the coil, the other end of the copper rod 3 on the upper right (left end of FIG. 1C) and the other end of the copper rod 3 on the lower left (left end of FIG. 1C) are electrically connected with each other by the conductive coupler 19, and one end of the copper rod 3 on the lower left of FIG. 1A (right end of FIG. 1C) and one end of the copper rod 3 on the lower right (right end of FIG. 1C) are electrically connected with each other through the conductive coupler 19. Consequently, the other end of the copper rod 3 on the upper left of FIG. 1A (left end of FIG. 1C) and the other end of the copper rod 3 on the lower right (left end of FIG. 1C) are allowed to form two ends of the coil, and thus electrically connected to a high-frequency power supply 91 through a high-frequency matching circuit 93 so that high-frequency power is applied to the coil. In this case, a coil 3C is formed by the copper rods 3 and the conductive couplers 19. The respective copper rods 3 are disposed in parallel with the elongated chamber, and are placed inside copper rod inserting holes 12 that are elongated holes surrounded by quartz that is a dielectric material. Gaps between the copper rod inserting hole 12 and the copper rods 3 are allowed to form a cooling water channel functioning as one example of a coolant passage to be connected to a coolant supply device 98 so that the copper rods 3 can be cooled.

Moreover, a pair of shield gas nozzles 13, serving as one example of a shield gas supply member, are disposed on a portion below the quartz block 4 and close to the substrate mounting base 1 (in other words, between the quartz block 4 and the substrate mounting base 1), with the plasma ejection port 8 sandwiched therebetween. The paired shield gas nozzles 13 are supported, for example, onto the brass block 5 by a support arm 13a and secured thereon. On the surfaces on the plasma ejection port 8 side of the respective shield gas nozzles 13, a large number of shield gas introducing ports 13b which are disposed in the longitudinal direction are opened, and in the inside of each of the shield gas nozzles 13, a shield gas manifold 14 which connects the shield gas supply device 92 and the large number of shield gas introducing ports 13b with one another is installed. In this manner, two types of gas introducing systems for a plasma gas and a shield gas are prepared, and in a separated manner from the plasma gas suitable for generating a plasma, the shield gas is supplied to the shield gas manifold 14 so as to be ejected from a large number of nozzles of the shield gas nozzles 13. Accordingly, it is possible to prevent gases, such as oxygen, carbon dioxide, and the like in the air, that are unnecessary for plasma processing or cause adverse effects thereto, from being mixed onto the plasma irradiation surface.

In the quartz block 4 and the brass block 5, there are provided cooling water pipes 15 which penetrate the quartz block 4 and the brass block 5 in the longitudinal direction and are connected to a cooling water supply device 98 serving as one example of a coolant supply device. That is, on the upper portion of the copper rod inserting hole 12 on the upper side and on the lower portion of the copper rod inserting hole 12 on the lower side of the square pillar member 4a of the quartz block 4, there are provided the cooling water pipes 15 which are prepared as through holes that respectively penetrate in the longitudinal direction. In the brass block 5, a large number of the cooling water pipes 15 that penetrate in the longitudinal direction are formed near the quartz block 4, in a manner so as to surround the quartz block 4. Each of the cooling water pipes 15 is a through hole having a diameter smaller than the copper rod inserting hole 12. Each of the cooling water pipes 15 of the quartz block 4 is made to have a diameter that is larger than each of the cooling water pipes 15 of the brass block 5 so that the quartz block 4 can be cooled more sufficiently than the brass block 5. The copper rod inserting holes 12 and the cooling water pipes 15 are water channels (coolant passages) disposed in parallel with one another, and brass blocks 16 are respectively disposed on the two ends of the quartz block 4 and the brass block 5 so that the copper rod inserting holes 12 and the cooling water pipes 15 are respectively made to penetrate the brass blocks 16. On the outside of the brass block 16, a resin case 17 having a concave portion inside thereof is formed so that a space between the concave portion of the resin case 17 and the brass block 16 is allowed to form a cooling water manifold 18 serving as one example of a coolant manifold. The copper rod inserting holes 12 and the cooling water pipes 15 communicate with the cooling water manifold 18. On the resin case 17, a cooling water inlet 18a and a cooling water outlet 18b, serving as examples of a coolant introducing port and a coolant discharging port that are respectively connected to the coolant supply device 98, are formed one by one (see FIG. 1D) so that the arrangement of the water cooling pipes onto the torch unit T are made very simple. Thus, it becomes possible to provide a small-size torch. In other words, two coolant manifolds 18 are placed on the two sides in the longitudinal direction of the elongated chamber 7 so that the coolant passages 12 and 15 that allow the two coolant manifolds 18 to communicate with the respective members 4 and 5 are prepared.

The copper rods 3 are electrically connected to one another by the couplers 19 inside the cooling water manifold 18 so that the four copper rods 3, as a whole, form a solenoid coil having a spiral shape with the number of turns of 2. All the copper rods 3 penetrate the brass block 16, and among the four copper rods 3, two copper rods 3 (for example, in the previous example, the other end of the copper rod 3 on the upper left of FIG. 1A (left end of FIG. 1C) and the other end of the copper rod 3 on the lower right (left end of FIG. 1C)) are connected to a copper plate 20 through a high-frequency introducing terminal hole or a ground terminal hole formed on the resin case 17 so that they are connected to the high-frequency power supply 91 through the copper plate 20, with the high-frequency matching circuit 93 interposed therebetween.

As described above, in the first embodiment, since the copper rod inserting holes 12 and cooling water pipes 15, each having a round cross-section, that penetrate the quartz block 4 are installed, a considerably greater amount of coolant is allowed to flow as compared with the water-cooling system having the double-pipe structure in the technique described in Japanese Unexamined Patent Publication No. 2009-545165 shown in the conventional examples.

Additionally, the gas introduction to the plasma gas manifold 9 is achieved by a plasma gas supply pipe 21 provided with a flow-rate control device such as a mass flow controller, which is placed on the upstream side thereof.

As described above, the plasma ejection port 8 having a rectangular slit shape is formed on the lower-end opening of the elongated chamber 7 of the square pillar member 4a made of a dielectric member of the quartz block 4, and the substrate mounting base 1 (or the substrate 2 on the substrate mounting base 1) is disposed so as to face the plasma ejection port 8. In this state, while a plasma gas is supplied into the elongated chamber 7, high-frequency power is supplied to the copper rods 3 forming a coil from the high-frequency power supply 91, and a plasma gas is ejected from the plasma ejection port 8 toward the substrate 2. Consequently, plasma is generated in the space inside the elongated chamber 7, and the plasma is applied onto the substrate 2 from the plasma ejection port 8 so that a thin film 22 on the substrate 2 is be plasma-processed. The substrate 2 is processed by shifting the elongated chamber and the substrate mounting base 1 relative to each other at a constant velocity by using the shifting device 94, in a direction perpendicular to the longitudinal direction of the plasma ejection port 8 along the horizontal plane. In other words, in a lateral direction of FIG. 1A, that is, in a direction perpendicular to the plane of the drawing of FIGS. 1B and 1C, the inductive coupling-type plasma torch unit T or the substrate mounting base 1 is moved.

Figure 1E:
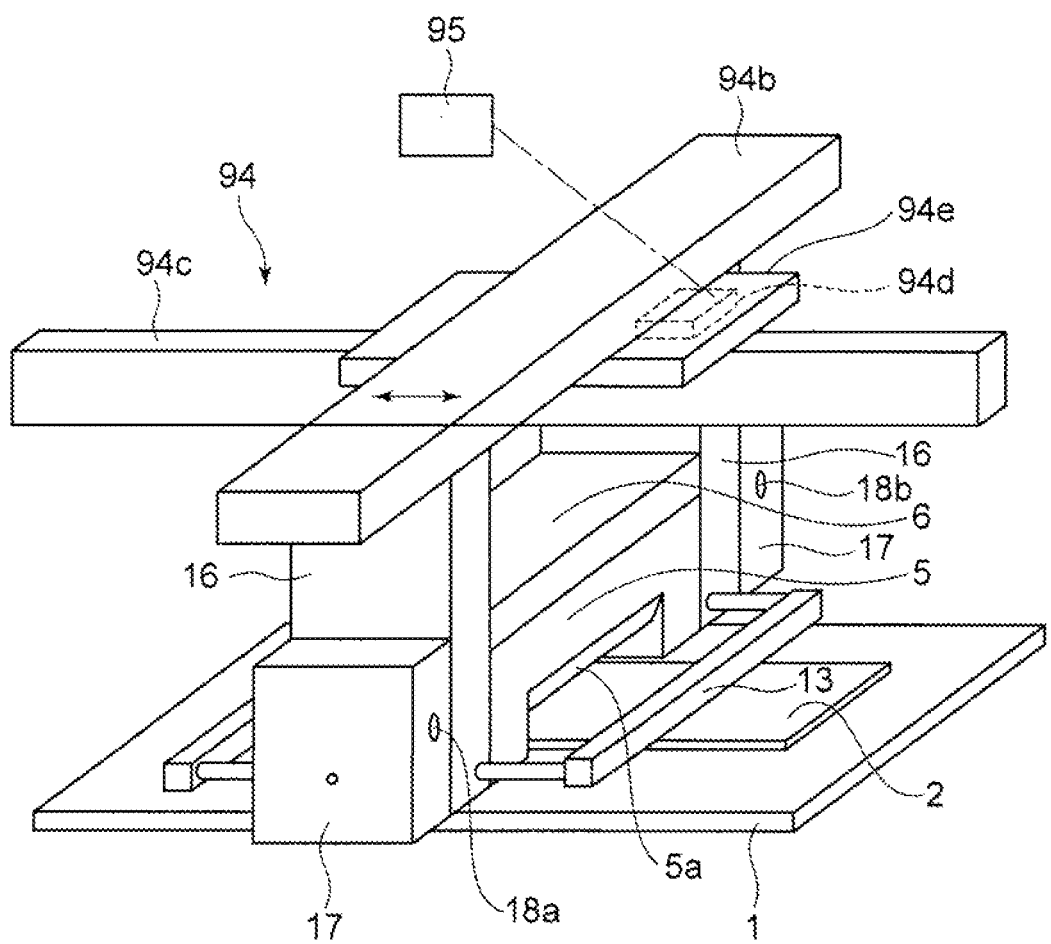
FIG. 1E is a perspective view showing the inductive coupling-type plasma torch unit and its moving device of one example of the plasma processing apparatus according to the first embodiment of the present invention.

FIG. 1E shows one example of the shifting device 94 that shifts the plasma torch unit T relative to the substrate 2 on the fixed substrate mounting base 1 at a constant velocity. In FIG. 1E, the shifting device 94 includes a bracket 94b to which the upper ends of the brass block 16 of the two ends of the plasma torch unit T are secured, a rail 94c that is extended along the shifting direction (a direction orthogonal to the longitudinal direction of the plasma torch unit T or the brass block 5) of the shifting device 94, and a shifting stage 94e to which the bracket 94b is secured, and which forwardly/reversely rotates a shift-driving motor 94d serving as one example of a shift-driving device so that the bracket 94b is shifted at a constant velocity along the rail 94c to which a screw shaft engaged with the motor 94d is secured. Thus, the shift-driving motor 94d is forwardly rotated under control by the control device 95 so that the shifting stage 94e proceeds or retreats at a constant velocity along the rail 94c, and the plasma torch unit T can be shifted relative to the substrate 2 through the bracket 94b.

In this manner, the plasma processing can be carried out while the plasma torch unit T3 is shifted at a constant velocity over the substrate 2 by the shifting device 94 under control by the control device 95.

When the plasma torch unit T3 is shifted over the substrate 2 by the shifting device 94, the shifting direction may be set to one direction, or may be reciprocally shifted.

The shifting device 94 may be applied to other embodiments or modified examples to be described later.

The control device 95 respectively controls operations of the gas supply device 90, the shield gas supply device 92, the high-frequency power supply 91, the shifting device 94, the coolant supply device 98, and the like so that desired plasma processing can be carried out.

The plurality of copper rods 3 are disposed in parallel with one another so that the four copper rods 3, as a whole, form a solenoid coil having a spiral shape with the number of turns of 2. That is, it is structured such that, among the plurality of conductor rods 3, high-frequency currents with reversed phases are allowed to flow through the conductor rods 3 that are made to face each other with the elongated chamber 7 being interposed therebetween ;for example, the conductor rod 3 on the upper right and the conductor rod 3 on the upper left in FIG. 1A, as well as the conductor rod 3 on the lower right and the conductor rod 3 on the lower left of FIG. 1A). In this case, on a cross-section taken along a plane perpendicular to the longitudinal direction of the torch unit T, an inductive electromagnetic field becomes stronger near the mid point of a line segment connecting the centers of the conductor rods 3 that are made to face each other with the elongated chamber 7 being interposed therebetween, so that an efficient plasma generating process may be achieved.

In contrast, as a modified example of the first embodiment, all of the two ends of the four copper rods 3 may be bundled with one another in the cooling water manifold 18, and high-frequency power may be supplied to the one side in the longitudinal direction, with the other side in the longitudinal direction being grounded, so that high-frequency currents having the same phase are allowed to flow through all of the four copper rods 3. That is, the structure may be such that among the plurality of conductor rods 3, the high-frequency currents having the same phase are allowed to flow through the conductor rods 3 that are made to face each other with the elongated chamber 7 being interposed therebetween. In this case, on the cross-section taken along a plane perpendicular to the longitudinal direction of the torch unit T, an inductive electromagnetic field becomes almost zero near the mid point of a line segment connecting the centers of the conductor rods 3 that are made to face each other with the elongated chamber 7 being interposed therebetween. However, since a strong inductive electromagnetic field is generated near the upper and lower ends of the elongated chamber 7, an efficient plasma generating process may be achieved.

Moreover, in this case, since the high-frequency current is branched into the four copper rods 3, an electric current per rod becomes smaller. In other words, in the case where copper rods 3 having the same thickness are used, a direct current resistivity and an inductance of the entire coil become smaller. Therefore, the copper loss in the coil becomes smaller so that the power efficiency is increased.

Furthermore, as another modified example of the first embodiment, coils with the number of turn of 1 may be disposed in parallel with each other on two upper and lower stages by bundling two conductor rods 3 disposed on the same side with the elongated chamber 7 interposed therebetween with each other inside the cooling water manifold 18. In this case as well, although among the plurality of conductor rods 3, high-frequency currents having the reversed phases are allowed to flow through the conductor rods 3 that are made to face each other with the elongated chamber 7 being interposed therebetween, a current per rod becomes smaller since the high-frequency currents are branched into the copper rods 3 of the two systems. In other words, in the case where copper rods 3 having the same thickness are used, a direct current resistivity and an inductance of the entire coil become smaller. Therefore, the copper loss in the coil becomes smaller and the power efficiency is increased.

Such a method for reducing the copper loss by devising the wiring structure is particularly effective in the case where the width of a substrate 2 to be processed is large, that is, in the case where the inductive coupling-type plasma torch unit T is long in the longitudinal direction.

Moreover, in this structure, on an arbitrary cross-section taken along a plane perpendicular to the longitudinal direction, which includes the elongated chamber 7, the shortest distance between the copper rod 3 and a conductor other than the copper rod 3 (brass block 5 and brass lid 6) becomes longer than the shortest distance between the copper rod 3 and the elongated chamber 7. In this case, the shortest distance between the copper rod 3 and the elongated chamber 7 means the shortest distance between the copper rod 3 and the space (a rectangular parallelepiped defining the space) inside the elongated chamber 7.

In general, since the inductive electromagnetic field formed by the high-frequency power supply is inversely proportional to the square of the distance from the high-frequency power supply, when the distance from the copper rod 3 to a conductor other than the copper rod 3 is closer than the distance between the copper rod 3 and the elongated chamber 7, an electromagnetic field that induces an eddy current inside a conductor other than the copper rod 3 becomes greater than the electromagnetic field that effectively generates plasma, and thus, the copper loss (eddy current loss) becomes greater.

In order to avoid this issue, the distance between the copper rod 3 and a conductor ether than the copper rod 3 is made longer than the distance between the copper rod 3 and the elongated chamber 7.

In such a structure, since it is necessary to keep a certain distance between the copper rods 3 and the plasma ejection port 8, the cooling water pipe 15 for cooling the quartz block 4 is disposed at a portion closer to the plasma ejection port 8 than to the copper rod 3 closest to the plasma ejection port 8. Similarly, the cooling water pipe 15 for cooling the quartz block. 4 is also disposed at a portion closer to the brass lid 6 than to the copper rod 3 closest to the brass lid 6.

Moreover, since a copper loss (eddy current loss) is generated in the brass block 5 and the brass lid 6 even if a distance from the copper rod 3 is kept, the cooling water pipe 15 is formed at a portion close to the copper rods 3 in order to avoid this issue.

Although various kinds of gases may be applicable as the plasma gas to be supplied into the elongated chamber 7, it is desirable that an inert gas is mainly used in view of plasma stability, igniting characteristic, service life of members to be exposed to plasma, or the like. Among the inert gases, an Ar gas is typically used. In the case where only the Ar gas is used to generate plasma, the plasma has a considerably high temperature (10,000 K or more). On a portion corresponding to the downstream side of the plasma ejection port 8 of the brass block 5, a pair of inclined surfaces 5a, each of which is opened wider toward the downward side, are formed so that a space that is gradually widened toward the substrate 2 is formed. With such a structure, it is possible to suppress a reduction in the plasma density due to contact of plasma against the brass block 5, and also to install the cooling water pipe 15 on a position close to the contact portion with plasma.

In this structure, since the length dimension in the longitudinal direction of the plasma ejection port 8 is set to be longer than the width dimension of the substrate 2, a scanning process of one time (shifting the torch unit T and the substrate mounting base 1 relative to each other) makes it possible to process the entire thin film 22 on the proximity of the surface of the substrate 2.

In such a plasma processing apparatus, by supplying high-frequency power of 13.56 MHz to the copper rods 3 forming a coil from the high-frequency power supply 91 while an Ar gas or Ar+$H_2$ gas is supplied into the elongated chamber 7, through a plasma gas supply hole 11 and while a plasma gas is injected toward the substrate 2 from the plasma ejection port 8, a high-frequency electromagnetic field is generated in the space inside the elongated chamber 7 to generate plasma, and by applying the plasma onto the substrate 2 from the plasma ejection port 8 and scanning over the substrate 2 the torch unit T by the shifting device 94, a heating treatment such as crystallizing of the semiconductor film can be carried out over the entire desired processing region of the substrate 2 in a short period of time.

As described above, since the elongated chamber 7 and the substrate mounting base 1 are relatively shifted in a direction perpendicular to the longitudinal direction of the plasma ejection port 8, with the longitudinal direction of the plasma ejection port 8 and the substrate mounting base 1 being kept in parallel with each other, the length dimension of plasma to be generated and the processing length dimension of the substrate 2 can be structured to be almost equal to each other. In this case, the width dimension (width dimension of the inner space of the chamber 7 in FIG. 1A) on the cross-section of the elongated chamber 7 taken along a plane perpendicular to the center axis thereof may be the same as the width dimension of the plasma ejection port 8 (the width dimension of the gap in FIG. 1A), or maybe set slightly larger than this width dimension. In other words, the volume of plasma to be generated can be made extremely smaller as compared with that of a conventional structure. As a result, it is possible to remarkably increase the power efficiency.

Moreover, in the inner space of the elongated chamber 7, since plasma can be generated relatively uniform in the longitudinal direction, the substrate 2 can be more uniformly processed as compared with the conventional example disclosed in Japanese Unexamined Patent Publication No. 2009-545165 or the like.

Furthermore, the torch unit T is of an inductive coupling type, and since a plurality of conductor rods 3 are disposed on the two sides of the chamber 7 in a manner so as to bridge over the chamber 7, the plasma generating efficiency becomes higher. Since the wall surface of the chamber 7 is surrounded by the water cooling passage, the wall surface of the chamber 7 can be efficiently cooled and the torch unit can be operated stably as a thermal plasma source.

(Second Embodiment)

A second embodiment of the present invention will be described below with reference to FIG. 3.

Figure 3:
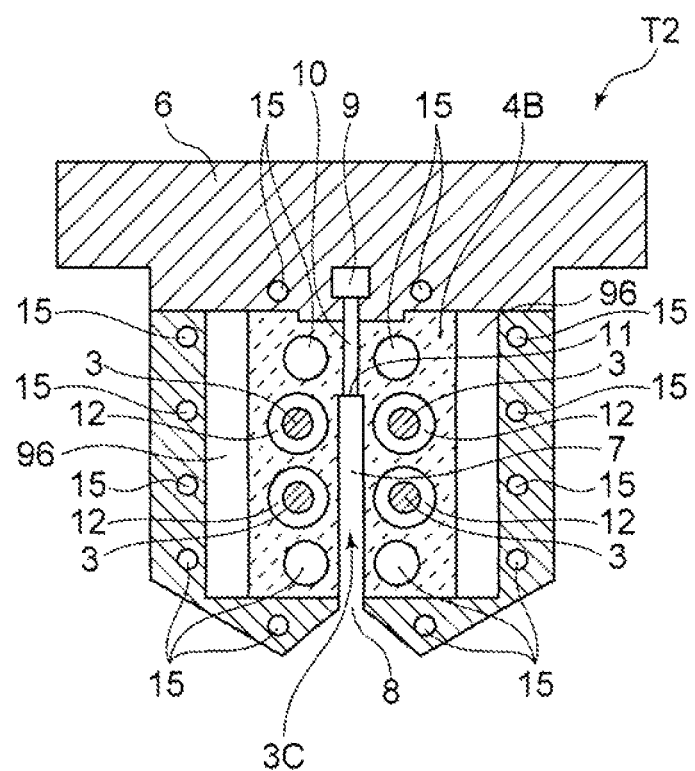
FIG. 3 is a cross-sectional view showing a structure of a plasma processing apparatus according to a second embodiment of the present invention.

FIG. 3 shows a structure of a plasma processing apparatus according to the second embodiment of the present invention, and is a cross-sectional view of an inductive coupling-type plasma torch unit T2 taken along a plane perpendicular to the longitudinal direction thereof, which corresponds to FIG. 1A.

Since the second embodiment of the present invention is different from the first embodiment only in a shape of a quartz block 4B, the description other than this will be omitted.

In FIG. 3, the quartz block 4B is housed inside the brass block 5 and the brass lid 6 serving as one example of a conductor case that is grounded with an air layer interposed therebetween. That is, in FIG. 3, the width of the quartz block 43 is made shorter than that of the quartz block 4 in FIG. 1A, a space 96 is formed by the quartz block 43, the brass block 5, and the brass lid 6, and the space 96 is filled with air serving as one example of an abnormal discharging preventive gas so as to provide an air layer.

In the first embodiment, when the torch unit T is driven for a long period of time, an inert gas such as Ar of the plasma gas invades into a gap between the quartz block 4 and the brass block 5 or the brass block 6, so that an abnormal discharge may occur in this gap. In order to avoid this, the air layer is formed by the abnormal discharging preventive space 96 in the second embodiment. In order to suppress a residing inert gas such as Ar more reliably, a hole that allows the space 96 and the outside space of the torch unit to communicate with each other may be formed, or by using a fan or the like, the accelerated exchange of the gas forming the air layer of the space 96 and the gas in the space outside the torch unit may be effective.

The description has been given here on the assumption that the ambient gas in the space outside the torch unit is air. However, even in the case where the ambient gas in the space outside the torch unit is a gas such as $N_2$, that is, an inert gas that requires a high discharge starting voltage under the atmospheric pressure, the same effects can be obtained. Alternatively, air, $N_2$, or the like may be supplied to this air layer by using a flow-rate control device so that a residing inert gas, such as Ar, can be effectively avoided.

Moreover, in the second embodiment, another advantage is achieved in which weights of the quartz block 48 and the torch unit T2 can be reduced.

(Third Embodiment)

A third embodiment of the present invention will be described below with reference to FIG. 4A.

Figure 4A:
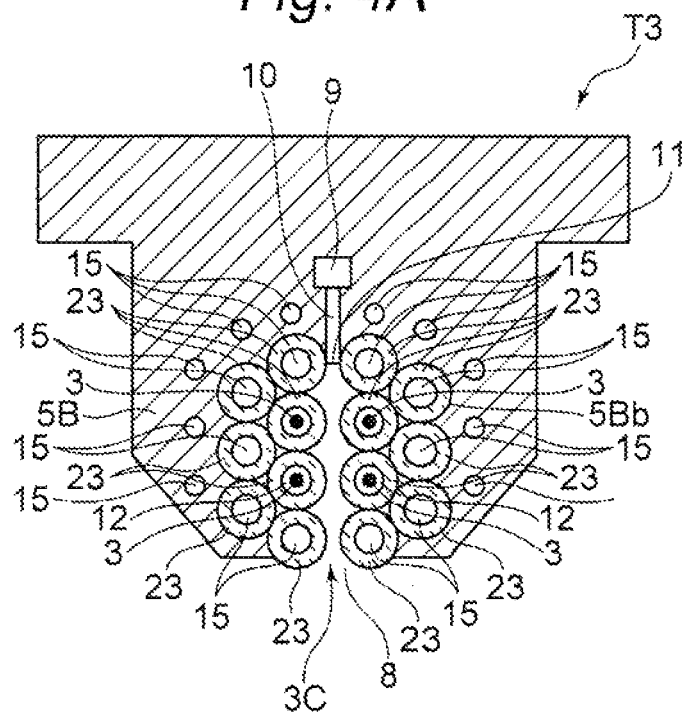
FIG. 4A is a cross-sectional view showing a structure of a plasma processing apparatus according to a third embodiment of the present invention.

FIG. 4A shows a structure of a plasma processing apparatus according to the third embodiment of the present invention, and is a cross-sectional view of an inductive coupling-type plasma torch unit T3 taken along a plane perpendicular to the longitudinal direction thereof, which corresponds to FIG. 1A.

In FIG. 4A, in place of the quartz block 4 of the first embodiment, a large number of quartz pipes 23 serving as one example of dielectric tubes are installed. That is, each of the copper rod inserting holes 12 used as elongated holes for housing the copper rods 3 and the cooling water pipes 15 is formed as an inner space of each of the quartz pipes 23 corresponding to cylindrical tubes made of a dielectric member. Moreover, the inner space of the elongated chamber 7 is formed by gaps among the plurality of bundled quartz pipes 23. In other words, instead of installing the quartz block 4, on the two sides of the inside of a concave portion 5Bb in the lower center portion of the brass block. 58, sets of quartz pipes 23, each having three pipes, for forming the cooling water pipes 15 inside thereof, are aligned side by side in the vertical direction. Moreover, on the inner side thereof, a quartz pipe 23 for forming the cooling water pipe 15 inside thereof, two quartz pipes 23 for forming the copper rod inserting holes 12 inside thereof, and a quartz pipe 23 for forming the cooling water pipe 15 inside thereof, that is, the total of four quartz pipes 23, are aligned side by side in the vertical direction. Thus, an elongated chamber 7 is formed by using spaces corresponding to gaps formed between surfaces of these four quartz pipes 23 that are made to face each another. In a brass block 58 located further inner side of the three quartz pipes 23 that are placed at each of the two sides inside the concave portion 5Bb in the lower center portion of the brass block 5B, a through hale for use as the cooling water pipe 15 having a diameter smaller than that of the inner through hole of each quartz pipe 23 is formed in the same manner as in the first embodiment.

In the quartz block 9 in the first embodiment, the parts becomes relatively expensive since a large number of thin elongated holes 12 and 15 are required to be formed in the longitudinal direction. However, the cylindrical quartz pipes 23 are inexpensive since these are ready-made products that are mass-produced, and by bundling the quartz pipes 23 with one another to form the elongated chamber 7, an inexpensive plasma processing apparatus can be realized.

As a modified example of the third embodiment, a structure in which the second embodiment and the third embodiment are combined with each other will be described. FIGS. 4B to 4E show an inductive coupling-type plasma torch unit T3A according to the modified example of the third embodiment.

Figure 4B:
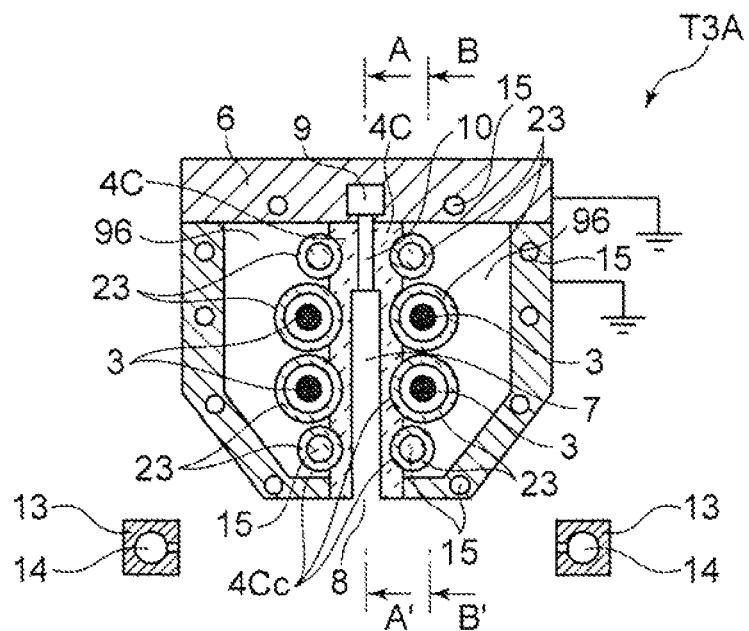
FIG. 4B is a cross-sectional view showing a structure of a plasma processing apparatus according to a modified example of the third embodiment of the present invention.
Figure 4E:
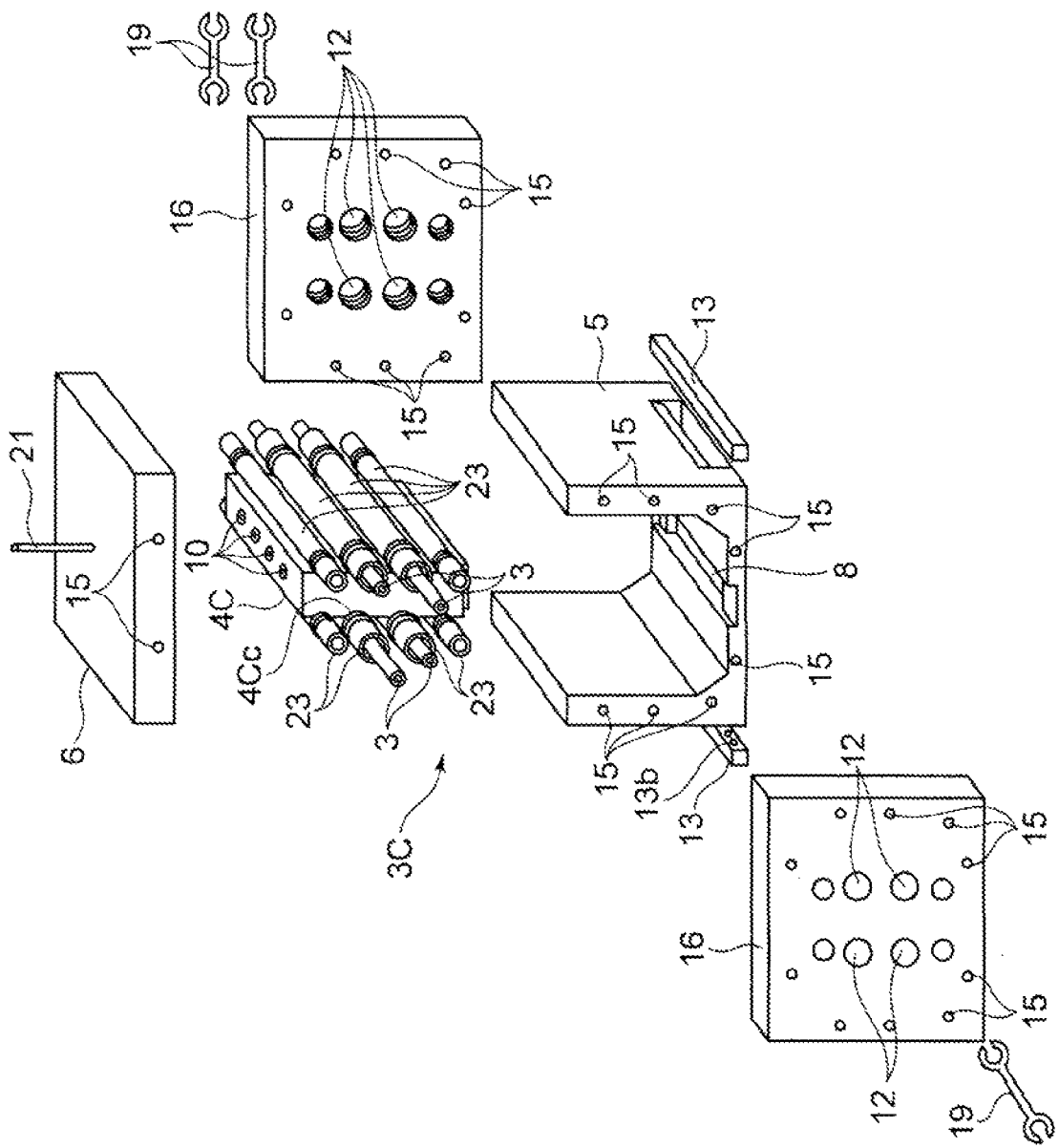
FIG. 4E is a perspective view showing a structure of the plasma processing apparatus according to the modified example of the third embodiment of the present invention.

FIG. 4B is a cross-sectional view taken along a plane perpendicular to the longitudinal direction of the inductive coupling-type plasma torch unit T3A of the present invention. FIGS. 4C and 4D are cross-sectional views taken along a plane that is in parallel with the longitudinal direction of the inductive coupling-type plasma torch unit T3A, and perpendicular to the substrate 2. FIG. 4C is a cross-sectional view taken along broken line A-A' of FIG. 4B, and FIG. 4D is a cross-sectional view taken along broken line B-B' of FIG. 4B. FIG. 4B is a cross-sectional view taken along a broken line of FIG. 4C. Moreover, FIG. 4E is a view showing an assembly structure of the inductive coupling-type plasma torch unit T3A shown in FIGS. 4B to 4D, which includes perspective views of respective parts (one portion) that are placed side by side.

In. FIG. 4B, a quartz block 4C is housed in a brass block 5 and a brass lid 6 serving as one example of a conductor case that is grounded, with an air layer interposed therebetween. That is, in FIG. 4B, the width of the quartz block 4C is made shorter than that of the quartz block 4 of FIG. 1A. Moreover, onto a curved concave portion (dielectric tube fitting concave portion) 4Cc on the outside surface of the quartz block 4C, four quartz pipes 23 are integrally secured with an adhesive or low-melting-point glass, with its inside half being embedded therein. In this structure, the four quartz pipes 23 on the right and left sides are secured by being aligned at the same height. Of the four quartz pipes 23 on the right and left sides, copper rods 3 are inserted to the two quartz pipes 23 in the center to be installed therein.

Thus, the quartz block 4C, the four quartz pipes 23, the brass block 5, and the brass lid 6 are combined to form a space 96, and this space 96 is filled with air so as to provide an air layer.

In this modified example, both of the effects of the second embodiment and the third embodiment can be obtained. Moreover, since the quartz pipes 23 and the quartz block 4C are formed into an integral unit by using the adhesive or low-melting-point glass, the inner wall surfaces of the chamber 7 that is in contact with plasma can be effectively cooled.

(Fourth Embodiment)

A fourth embodiment of the present invention will be described below with reference to FIG. 5.

Figure 5:
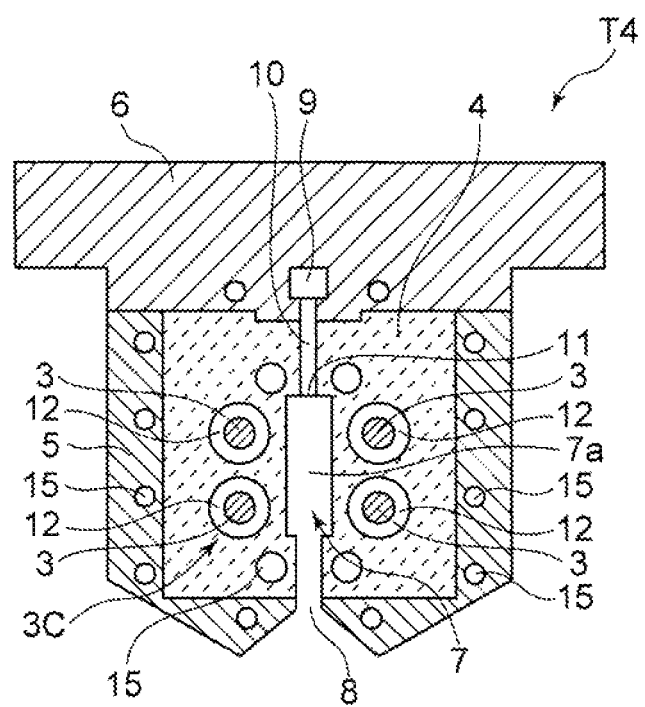
FIG. 5 is a perspective view showing a structure of a plasma processing apparatus according to a fourth embodiment of the present invention.

FIG. 5 shows a structure of a plasma processing apparatus according to the fourth embodiment of the present invention, and is a cross-sectional view of an inductive coupling-type plasma torch unit T4 taken along a plane perpendicular to the longitudinal direction thereof, which corresponds to FIG. 1A.

In FIG. 5, in the mid portion in the vertical direction of the elongated chamber 7, a wide width portion 7a is provided, and its width dimension in a direction perpendicular to the longitudinal direction of the elongated chamber 7 is made wider than the width dimension in a direction perpendicular to the longitudinal direction of the plasma ejection port 8. With the wide width portion 7a, the discharging space can be made larger so that it is possible to generate plasma more stably.

With this structure, by ensuring a discharging space having a sufficient size, a stable plasma processing operation can be achieved.

(Fifth Embodiment)

A fifth embodiment of the present invention will be described below with reference to FIG. 6.

Figure 6:
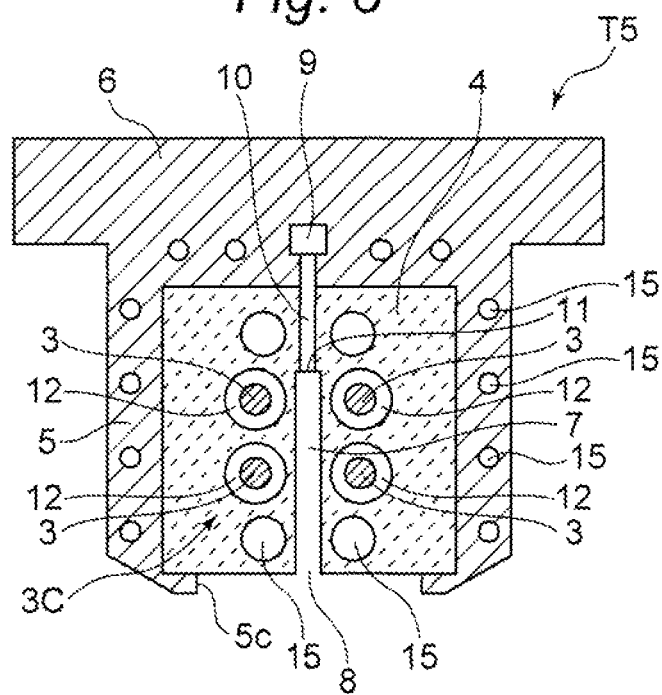
FIG. 6 is a cross-sectional view showing a structure of a plasma processing apparatus according to a fifth embodiment of the present invention.

FIG. 6 shows a structure of a plasma processing apparatus according to the fifth embodiment of the present invention, and is a cross-sectional view of an inductive coupling-type plasma torch unit T5 taken along a plane perpendicular to the longitudinal direction thereof, which corresponds to FIG. 1A.

In FIG. 6, the width dimension of the plasma ejection port 8 serving as one example of an opening 5c formed on the lowermost portion of the brass block 5 is made larger than the width dimension of the opening of the quartz block 4 forming the plasma ejection port 8.

In this structure, since the high-frequency electromagnetic field generated by the copper rods 3 allows plasma excitation to exert further downward, the plasma discharging intensity is increased so that it becomes possible to exert plasma having a higher temperature on the substrate 2.

(Sixth Embodiment)

A sixth embodiment of the present invention will be described below with reference to FIG. 7.

Figure 7:
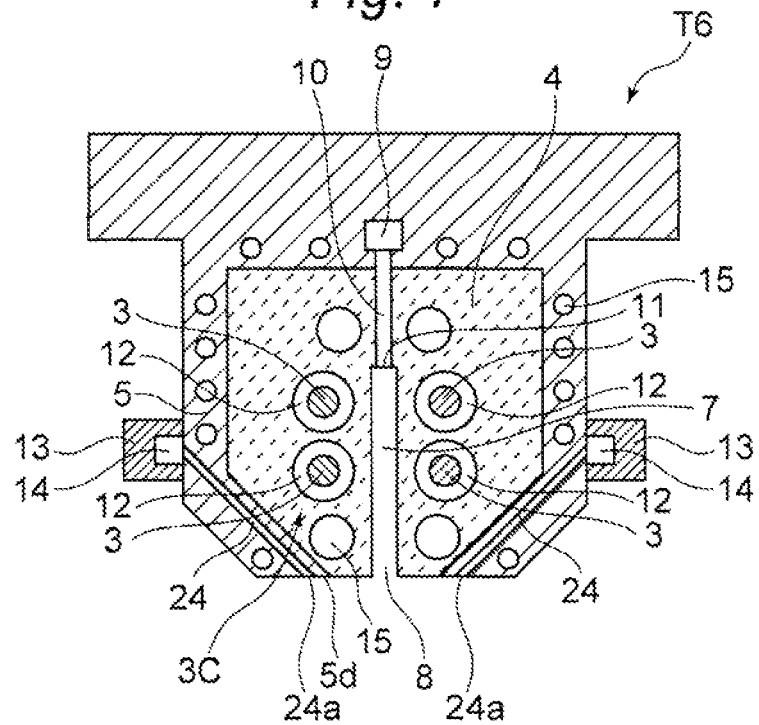
FIG. 7 is a perspective view showing a structure of a plasma processing apparatus according to a sixth embodiment of the present invention.

FIG. 7 shows a structure of a plasma processing apparatus according to the Sixth embodiment of the present invention, and is a cross-sectional view of an inductive coupling-type plasma torch unit T6 taken along a plane perpendicular to the longitudinal direction thereof, which corresponds to FIG. 1A.

In FIG. 7, the width dimension of an opening 5d formed on the lowermost portion of the brass block 5 is made slightly larger than the width dimension of a plasma ejection port 8 serving as one example of the opening of the quartz block 4 forming the plasma ejection port 8. In the first embodiment, these are almost the same width. The concentration of an inert gas such as Ar is increased in a space between the torch unit T6 and the substrate 2, and therefore, since the structure of the first embodiment allows the lowermost portion of the brass block 5 to block the high-frequency electromagnetic field, the plasma excitation in this space is effectively suppressed.

In contrast, in order to suppress the plasma excitation in this space, the sixth embodiment has a structure in which a shield gas is ejected to the proximity of the plasma ejection port 8 from a shield gas supply pipe installed in the brass block 5.

In other words, while an inert gas such as Ar is supplied to the space inside the elongated chamber 7 to generate plasma, a gas such as $N_2$ serving as one example of a shield gas, that is, an inert gas that requires a high discharge starting voltage under the atmospheric pressure, is supplied to the proximity of the plasma ejection port 8 in a manner so as to sandwich a long ejecting plasma from directions perpendicular to the longitudinal direction, so that the plasma is formed into an elongated shape. In this case, a shield gas nozzle 13 is secured so as to form a gap with the outer surface of the lower portion of the brass block 5 so that a shield gas manifold 19 is formed between the shield gas nozzle 13 and the brass block 5. On the proximity of the outer surface of the lower portion of the brass block 5, a shield gas injection passage 24 the upper end of which communicates with the shield gas manifold 14, and which is inclined toward the center of the lower end of the brass block 5, is formed so as to allow the lower end thereof to form a shield gas ejection port 24a. This shield gas ejection port 24a may be prepared as a slit-shaped gas outlet that is in parallel with the plasma ejection port 8, or as a large number of gas outlets formed as holes that are placed in parallel with the plasma ejection port 8.

(Seventh Embodiment)

A seventh embodiment of the present invention will be described below with reference to FIG. 8.

Figure 8:
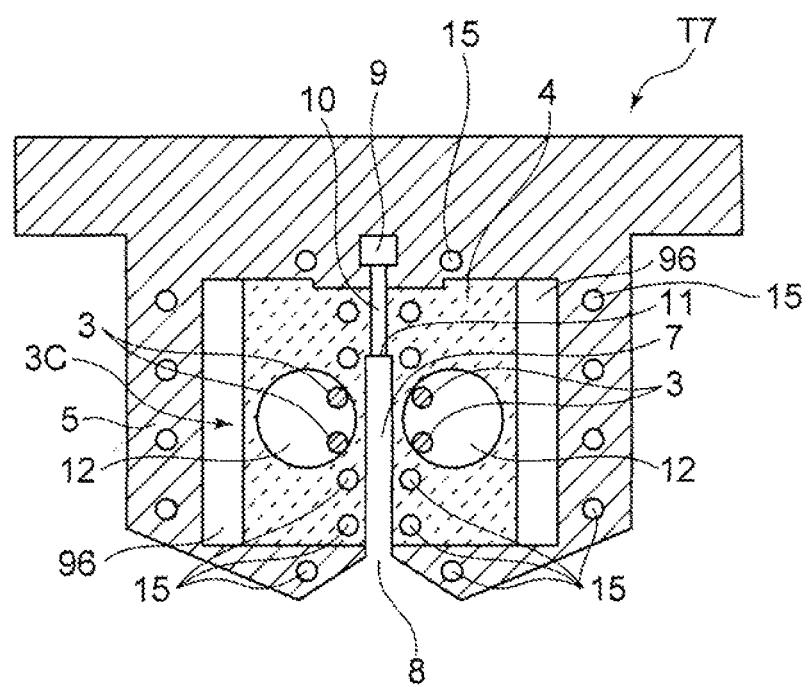
FIG. 8 is a cross-sectional view showing a structure of a plasma processing apparatus according to a seventh embodiment of the present invention.

FIG. 8 shows a structure of a plasma processing apparatus according to the seventh embodiment of the present invention, and is a cross-sectional view of an inductive coupling-type plasma torch unit T7 taken along a plane perpendicular to the longitudinal direction thereof, which corresponds to FIG. 1A.

In FIG. 8, a copper rod inserting hole 12 has a diameter of a circle corresponding to its cross-section that is made larger than that of holes forming the other cooling water pipes 15, and a plurality of copper rods 3 are housed inside each of the copper rod inserting hole 12 on the side near the slit 7. This structure is effectively used for reducing the number of elongated holes to be formed in the quartz block 4.

(Eighth Embodiment)

An eighth embodiment of the present invention will be described below with reference to FIGS. 9A to 14.

FIG. 9A shows a structure of a plasma processing apparatus according to the eighth embodiment of the present invention, and is a cross-sectional view of an inductive coupling-type plasma torch unit T8 taken along a plane perpendicular to the longitudinal direction thereof, which serves as one example of the plasma processing apparatus.

Figure 9B:
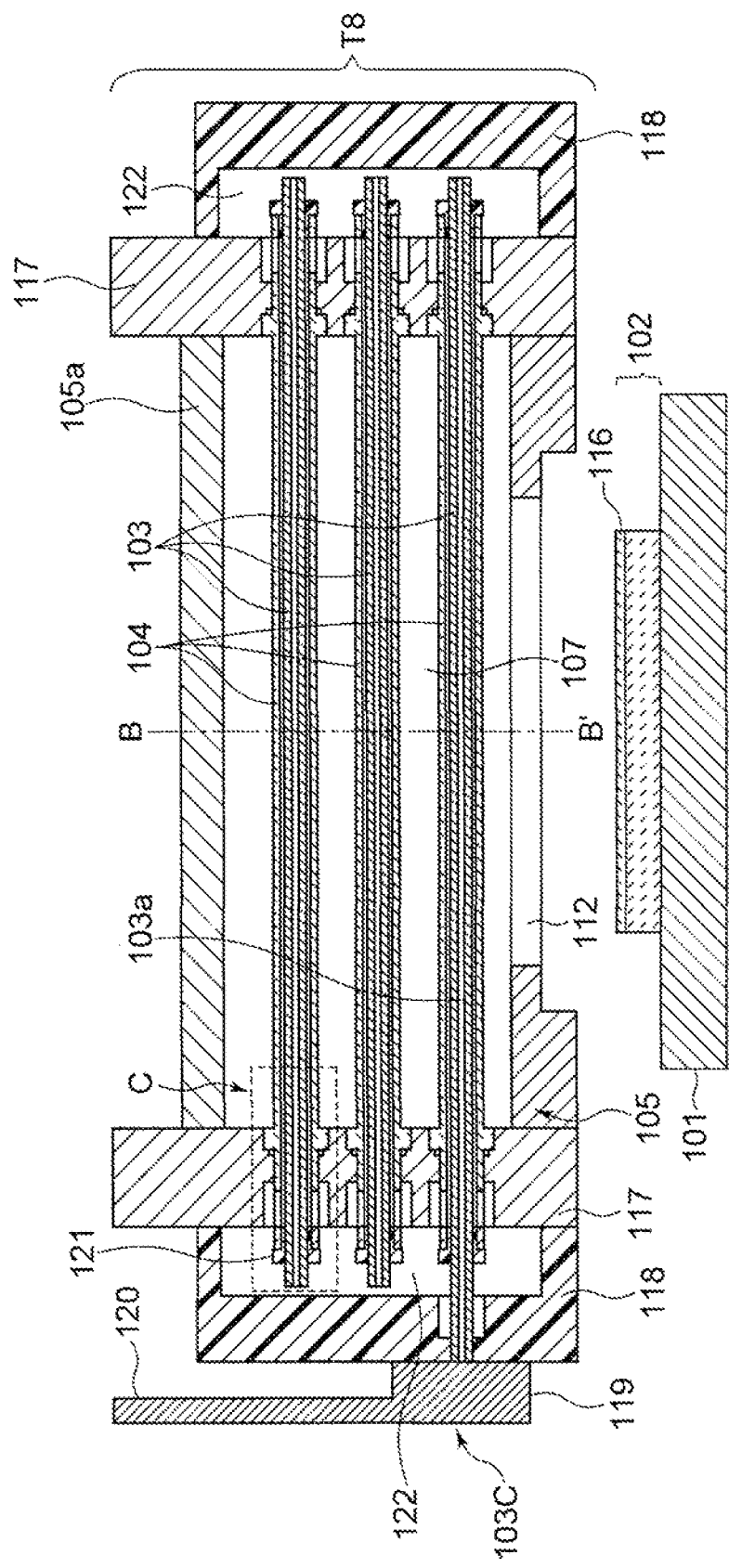
FIG. 9B is a cross-sectional view showing the structure of the plasma processing apparatus according to the eighth embodiment of the present invention.

Moreover, FIG. 9B is a cross-sectional view taken along broken line A-A' of FIG. 9A, which includes the center axis of the conductor rod 103, and is a cross-sectional view taken along a plane perpendicular to the substrate 102.

Figure 11:
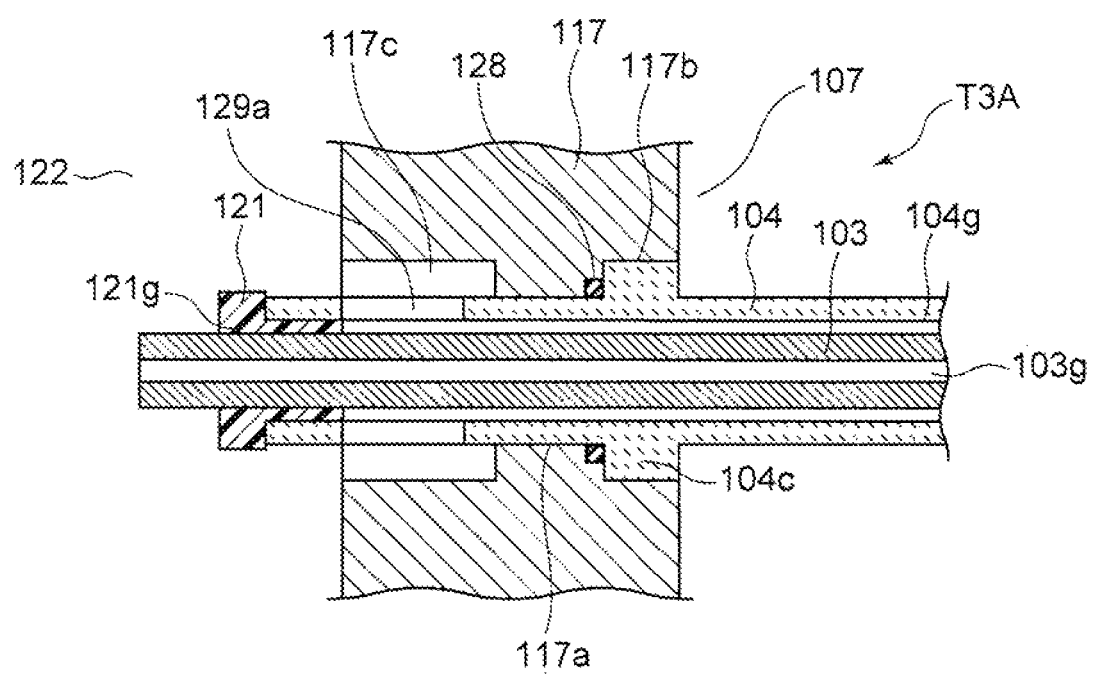
FIG. 11 is a cross-sectional view showing the structure of the plasma processing apparatus according to the eighth embodiment of the present invention.
Figure 12:
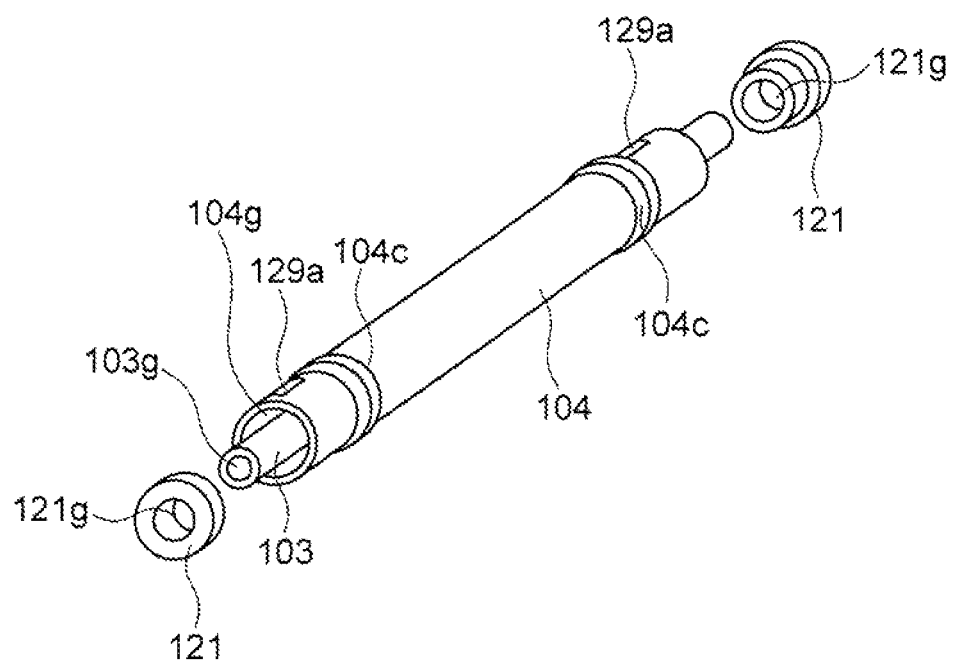
FIG. 12 is a perspective view showing the structure of the plasma processing apparatus according to the eighth embodiment of the present invention.
Figure 13:
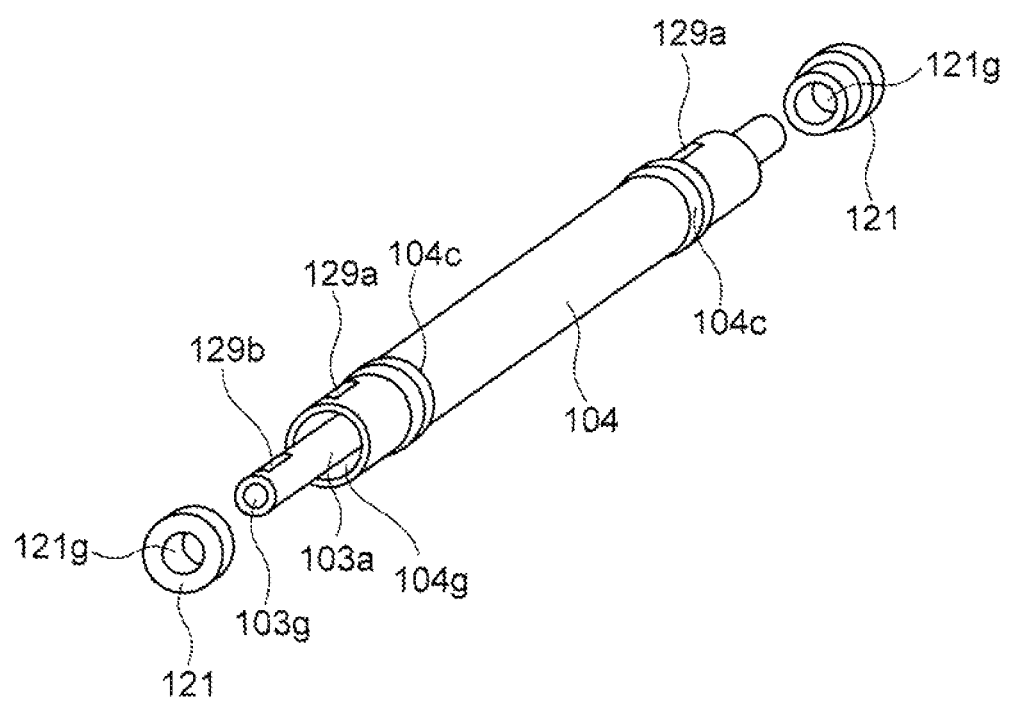
FIG. 13 is a perspective view showing the structure of the plasma processing apparatus according to the eighth embodiment of the present invention.
Figure 14:
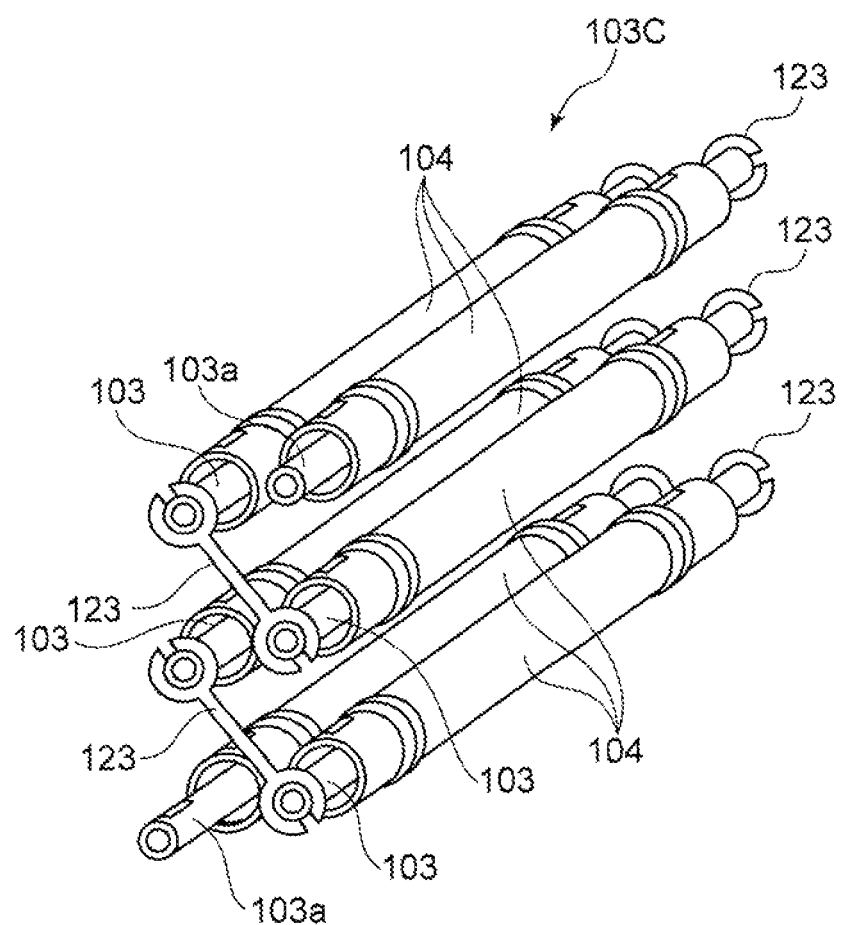
FIG. 14 is a perspective view showing the structure of the plasma processing apparatus according to the eighth embodiment of the present invention.

FIG. 9A is a cross-sectional view taken along broken line B-B' of FIG. 9B. Moreover, FIG. 10 is a view showing an assembly structure of the inductive coupling-type plasma torch unit T8 shown in FIG. 9A, which includes perspective views of respective parts that are placed side by side. FIG. 11 is an enlarged cross-sectional view of a C portion of FIG. 9B. Moreover, FIG. 12 is a perspective view showing a perimeter structure of the conductor rod 103, FIG. 13 is a perspective view showing a perimeter structure of the long conductor rod 103, and FIG. 14 is a perspective view showing the arrangement of the conductor rods 103 and conductor links 123.

In FIGS. 9A to 10, a substrate 102 is mounted on a substrate mounting base 101. In the inductive coupling-type plasma torch unit T8, a coil serving as one example of a conductive unit is prepared by connecting a plurality of conductor rods 103, disposed in parallel with the longitudinal direction of a chamber 107, with one another by the conductor links (conductive couplers or connectors) 123 that are disposed perpendicular to the longitudinal direction of the chamber 107 so as to form a structure having a spiral shape as a whole, in which the inner space of the spiral shape and the inner space of the chamber 107 are overlapped with each other. For example, as shown in FIG. 14, one end of the conductor rod 103 on the left-side upper end (left end of FIG. 9B) and one end of the conductor rod 103 in the middle on the right side (left end of FIG. 9B) are electrically connected with each other by the conductor link 123, the other end of the conductor rod 103 in the middle on the right side (right end of FIG. 9B) and the other end of the conductor rod 103 in the middle on the left side (right end of FIG. 9B) are electrically connected with each other by the conductor link 123, one end of the conductor rod 103 in the middle on the left side (left end of FIG. 9B) and one end of the conductor rod 103 on the right-side lower end (left end of FIG. 9B) are electrically connected with each other by the conductor link 123, and the other end of the conductor rod 103 on the right-side lower end (right end of FIG. 9B) and the other end of the conductor rod 103 on the left-side lower end (right end of FIG. 9B) are electrically connected with each other by the conductor link 123 so that the other end of the conductor rod 103 on the left-side lower end (left end of FIG. 9B) and the other end of the conductor rod. 103 on the right-side upper end (left end of FIG. 9B) form two ends of the coil; thus, these are electrically connected to a high-frequency power supply 91 with a high-frequency matching circuit 93 interposed therebetween so that high-frequency power is applied to the coil. In this case, the conductor rods 103 and the conductor links (conductive coupler or connector) 123 form a coil 103C. The plurality of conductor rods 103 are respectively inserted into through holes 104g (see FIG. 11) inside of quartz pipes 104 serving as one example of dielectric tubes in a manner so as to penetrate the quartz pipes 104. On the periphery of the quartz pipes 104, a brass block 105 serving as one example of a case or a device main-body block forming the wall surfaces of the chamber 107 is disposed, and the outside of each of the quartz pipes 104 is in contact with the brass block 105. In other words, the brass block 105 has a T-shape in its longitudinal cross-section with two divided blocks 105a, each having a J-shape in its longitudinal cross-section, being joined to each other, and its center portion in the width direction orthogonal to the longitudinal direction of the brass block 105 is extended in the longitudinal direction over the entire length in the longitudinal direction so that a concave portion 105b that recesses upward from the lower-end opening is formed. Inside this concave portion 105b, three quartz pipes 104 are secured on each of the curved concave portions (dielectric tube fitting concave portions) 105c of the two side faces of the concave portion 105b, with its outside half each being embedded therein. In this case, the right and left respectively three quartz pipes 104 of FIG. 9A are not secured by being aligned at the same height, but in different heights so that the six quarts pipes 104 are disposed alternately, for example, with the right-side three quartz pipes 104 being set to a higher position than that of the left-side three quartz pipes 104 with a difference of about the radius dimension thereof. Therefore, the inside space of the chamber 107 is a thin elongated space surrounded by the quartz pipes 104, the concave portion 105b of the brass block 105, and the brass blocks 117 that are disposed on the two sides in the longitudinal direction of the brass block 105. In other words, one portion of each of the quartz pipes 104 (the outer surface of a semi-cylindrical portion protruding inward) is exposed to the space inside the chamber 107 so as to be placed to form one portion of the wall surface.

Above the concave portion 105b of each of the divided blocks 105a forming the brass block 105, a groove that makes a plasma gas manifold 108 is formed, and a groove, which makes a plasma gas supply hole 109 serving as one example of a gas introducing port that allows the plasma gas manifold 108 and the concave portion 105b, that is, the chamber 107, to communicate with each other, is formed. Therefore, upon forming the brass block 105 by combining the two divided blocks 105a with each other, these grooves are respectively joined with each other to form closed spaces so that this structure defines and forms the plasma manifold 108 and the plasma gas supply hole 109. Moreover, on the outside in the width direction orthogonal to the longitudinal direction of the brass block 105, rectangular plate-shaped lids 106 are respectively placed. On the inner surface of the lid 106 on the brass block 105 side, a counterbore that provides a, sheath gas manifold 110 is formed, and when this is combined with the brass block 105, the space surrounded by the brass block 105 and the lid 106 provides a closed space so that the sheath gas manifold 110 is defined and formed. Moreover, in the brass block 105, a through hole that provides a sheath gas supply hole 111 that extends from each of the sheath gas manifolds 110 in the width direction of the brass block 105 to reach the outer surface of each of the quartz pipes 104 is formed. The sheath gas supply device 97 is connected to the respective sheath gas manifolds 110 so that a sheath gas (dielectric tube protective gas) can be supplied from the sheath gas supply device 97 controlled by the control device 95 to the sheath gas manifolds 110. The sheath gas, which is supplied to the sheath gas manifolds 110, reaches the outer surface of each of the quartz pipes 104 from the sheath gas supply holes 111, and is directed around the outer surface of each quartz pipe 104 from the gap between the curved concave portion 105c and the quartz pipe 104 so that the sheath gas is introduced into the chamber 107.

Moreover, on a portion near the substrate mounting base 101 below the lid 106 (in other words, between the lid 106 and the substrate mounting base 101), a pair of shield gas nozzles 113 serving as one example of a shield gas supply member are disposed with the plasma ejection port 108 sandwiched therebetween. The paired shield gas nozzles 113 are supported on the brass block 105 by, for example, a not-shown support arm (see the support arm 13a of the first embodiment) to be secured therein. On the surface of each of the shield gas nozzles 113 on the plasma gas ejection port 108 side, a large number of shield gas introducing ports 113a placed in the longitudinal direction are opened, and in the inner portion of each shield gas nozzle 113, a shield gas manifold 114 used for connecting the shield gas supply device 92 to the plurality of nozzles is installed. In this manner, three types of gas introducing systems for the plasma gas, sheath gas, and shield gas are prepared so that by appropriately adjusting the gas types, gas flow rates, or the like in a divided manner into a plasma gas suitable for generating plasma and a sheath gas for protecting the outer wall surface of each of the quartz pipes 104, it is possible to carry out a stable plasma processing operation, and also to prevent gases, such as oxygen, carbon dioxide, and the like in the atmosphere, that are unnecessary for plasma processing or cause adverse effects thereto, from being mixed onto the plasma irradiation surface by additionally supplying a shield gas.

In this structure, a coolant supply device 98 is connected to the inside of a through hole 104g inside the quartz pipe 104 in which the conductor rod 103 is placed so that the inside thereof is immersed with water serving as one example of an insulating fluid, and by allowing water serving as one example of the coolant to flow therethrough, the quartz pipe 104 and the conductor rod 103 are cooled. Moreover, each of the conductor rods 103 is a hollow tube, and water serving as one example an insulating fluid supplied from the coolant supply device 98 is allowed to also flow into the through hole 103g (see FIG. 11) inside the conductor rod 103 so that the conductor rods 103 are cooled. In other words, the insulating fluid serving as one example of the coolant is allowed to flow through a space between the outer wall surface of each of the conductor rods 103 and the inner wall surface of each of the quartz pipes 104 so that the conductor rods 103 and the quartz pipes 104 are cooled, and in this structure, each conductor rod 103 is prepared as a hollow tube so that by allowing the insulating fluid serving as one example of the coolant to flow through the inner space of the tube formed by the conductor rod 103, the conductor rod 103 is cooled.

Moreover, in the brass block 105, cooling water pipes 115 serving as coolant passages penetrating the block 105 are formed near the concave portion 105b, and are connected to the coolant supply device 98. More specifically, these water channels (coolant passages) are allowed to communicate with the coolant supply device 98 through each of cooling water manifolds 122 which is placed outside of each brass block 117 and formed by a space between the resin case 118 and the brass block 117. On the resin case 118, a cooling water inlet 124a and a cooling water outlet 124b serving as a coolant introducing port and a coolant discharging port respectively connected to the coolant supply device 98 are formed one by one so that the arrangement of the water cooling pipes onto the inductive coupling-type plasma torch unit T8 are made very simple, and thus, it becomes possible to provide a small-size torch.

Among the conductor rods 103, two long conductor rods 103a corresponding to two ends of a coil (the conductor rod 103 on the right-side upper end and the conductor rod 103 on the left-side lower end in FIG. 1A, FIG. 10, and FIG. 14) are connected to a copper block 119 through a high-frequency introducing terminal hole 126 and a ground terminal hole 127 formed on the resin case 118 and further connected to a high-frequency matching circuit 93 through a copper plate 120.

A rectangular slit-shaped plasma ejection port 112 (sometimes referred to as "opening portion") that communicates with the chamber 107 is formed in the center of the lower end of the brass block 105, and the substrate mounting base 101 (or the substrate 102 on the substrate mounting base 101) is disposed so as to face the plasma ejection port 112. In this state, high-frequency power is supplied to the conductor rods 103 forming a coil from the high-frequency power supply 91 through the high-frequency matching circuit 93, while the gas is supplied into the chamber 107 with the gas being ejected from the plasma ejection port 112 toward the substrate 102. Thus, plasma is generated inside the chamber 107, and the plasma is applied onto the substrate 2 from the plasma ejection port 112 so that a thin film 116 on the substrate 102 can be plasma-processed.

This structure is characterized by a structure in which all the longitudinal direction of the chamber 107, the longitudinal direction of the conductor rods 103, and the longitudinal direction of the ejection port 112 are made in parallel with one another, and by relatively shifting the chamber 107 and the substrate mounting base 101 in a direction perpendicular to the longitudinal direction of the ejection port 112 by the shifting device (the same shifting device as the first embodiment) 94, the substrate 102 is processed. That is, the inductive coupling-type plasma torch unit T8 or the substrate mounting base 101 is moved in a lateral direction of FIG. 9A, that is, a direction perpendicular to the plane of drawing of FIG. 9B.

The following description will discuss the structure of a gas supply system. A plasma gas supply pipe 141 is formed on a flange 125. The flange 125 is combined with the upper end face of the brass block 105 so that the plasma gas supply pipe 141 is allowed to communicate with a plasma gas manifold 108 from the plasma gas supply pipe 141 and a through hole on the upper end face of the brass block 105. Moreover, sheath gas supply pipes 142 are respectively formed on the lid 106, and allowed to communicate with the sheath gas manifold 110 through a through hole inside the lid 106. A groove to be formed into the plasma manifold 108 is deep, and is engraved on the chamber 107 in parallel with its longitudinal direction as a long groove so as to serve as a gas reservoir. Grooves to be formed into the plasma gas supply holes 109 are shallow, and are engraved on the chamber 107 in its longitudinal direction as short grooves, and a large number of the grooves are prepared.

A gas outlet of each of the plasma gas supply holes 109 is positioned on a surface opposed to the ejection port 112. Each of the quartz pipes 104 is fitted to a curved concave portion 105c that is formed in a curved shape on the side face of the concave portion 105b formed in the brass block 105, and in this structure, a plasma gas is allowed to exude out from a small gap between the curved concave portion 105c of the brass block 105 and the quartz pipe 104 sideward, that is, in a direction perpendicular to a direction from the torch unit T8 toward the substrate 102. Suppose that the portion from which the gas exudes out into the gas chamber 107 is referred to as a gas introducing port, the gas introducing port is formed in parallel with the longitudinal direction of the ejection port 112, and this structure introduces the gas along the outer wall surface of each quartz pipe 104. In contrast, the shield gas is discharged toward a gap between the ejection port 112 and the substrate 102 from a plurality of holes, or a single groove, which are allowed to communicate with the shield gas manifold 114.

In this case, by devising the direction of the holes or the single groove, the direction of gas ejection can be directed to the ejection port 112 or the surface of the substrate 102, and the direction is selected on demand depending on the types of processes. With this structure, it becomes possible to protect the outer wall surface of each quartz pipe 104 serving as one example of a dielectric tube, by using a smaller gas flow rate.

The following description will discuss the way in which the cooling water is allowed to flow. In FIG. 11, the brass block 117 has a function for positioning the quartz pipes 104 so that the through holes 117a are formed according to the number of the quartz pipes 104. In each of the through holes 117a, counterbores 117b and 117c are formed from both of the sides, and an O-ring 128 for preventing water leakage is placed on the counterbore 117b on the inside, and a portion 104c of the quartz pipe 104 with a widened diameter is fitted thereto. As shown in FIGS. 11 and 12, a rectangular through hole 129a is formed near the tip of each of the two ends of the quartz pipe 104 so that when fitted to the brass block 117, the through hole 129a is placed into the counterbore 117c on the outside. The two ends of the quartz pipe 104 are closed by bushes 121 so as to make the center axes of the conductor rod 103 and the quartz pipe 104 coincident with each other.

Therefore, in this structure, from one of the cooling water manifolds 122, the cooling water passes through the counterbore 117c on the outside of one of the brass blocks 117 and the through hole 129a, and is allowed to flow into the through hole 104g inside the quartz pipe 104 from one end side, and on the other end side of the through hole 104g, the cooling water passes through the through hole 129a and the outside counterbore 117c of the other brass block 117 and goes out toward the other cooling water manifold 122. In this case, in the center of the bush 121, a through hole 121g, which allows the conductor rod 103 to penetrate and protrude therethrough, is formed so that the cooling water is allowed to flow into one end of the through hole 103g inside the conductor rod 103 from one of the cooling water manifolds 122, and to go out toward the other cooling water manifold 122 from the other end of the through hole 103g.

In this case, however, one end of the long conductor rod 103a has a structure to penetrate the high-frequency introducing terminal hole 126 and the ground terminal hole 127 formed on the resin case 118, and in order to allow water to communicate with the inside thereof, as shown in FIG. 13, the through hole 129b is formed near one of the end sides of the long conductor rod 103a so that by allowing the through hole 129b to face one of the cooling water manifolds 122, the cooling water is allowed to flow between one of the cooling water manifolds 122 and the through hole 129b. In other words, in this structure, the cooling water is allowed to flow from one of the cooling water manifolds 122 inside the counterbore formed in one of the resin cases 118 into one end of the through hole 103g inside the long conductor rod 103a through the through hole 129b, passes through the through hole 129a and the counterbore 117c outside the other brass block 117 from the other end of the through hole 103g inside the long conductor rod 103a, and goes out toward the other cooling water manifold 122 inside the counterbore formed in the other resin case 118.

Moreover, as shown in FIG. 14, the plurality of conductor rods 103 are connected with one another by the conductor link 123 to form a spiral shape with the number of turns of 3 so that the inner space of the spiral shape and the inner space of the chamber 107 are, overlapped with each other.

In this structure, the length dimension in the longitudinal direction of the plasma ejection port 12 is equal to or is made longer than the width dimension of the substrate 102 so that even a scanning process of one time (shifting the torch unit T8 and the substrate mounting base 101 relative to each other) makes it possible to carry out thermal treatment on the entire thin film 116 on the proximity of the surface of the substrate 102.

In this plasma processing apparatus, by supplying high-frequency power of 13.56 MHz from the high-frequency power supply 91 to the conductor rods 103 forming a coil while a gas is being ejected toward the substrate 102 from the plasma ejection port 112, with an Ar gas or Ar+$H_2$ gas being supplied into the chamber 107 through a plasma gas supply hole 109, and a $N_2$ gas being supplied from the respective shield gas introducing ports 113a of the shield gas nozzle 113, plasma is generated inside the chamber 107. Then, by applying the plasma onto the substrate 102 from the plasma ejection port 112, while scanning the substrate 102, heating treatment such as crystallizing of the semiconductor film can be carried out over the entire desired processing region of the substrate 102 in a short period of time.

As described above, since the chamber 107 and the substrate mounting base 101 are relatively shifted in a direction perpendicular to the longitudinal direction of the plasma ejection port 112, with the longitudinal direction of the plasma ejection port 112 and the substrate mounting base 101 being kept in parallel with each other, the length dimension of plasma to be generated and the processing length dimension of the substrate 102 can be designed to be almost equal to each other. In this case, it is only necessary for the width dimension (width dimension of the inner space of the chamber 107 in FIG. 9B) on the cross-section of the chamber 107 taken along a plane perpendicular to the center axis thereof to be made longer than the width dimension (length dimension of the gap in FIG. 9B) of the plasma ejection port 112 even in a small degree. In other words, the volume of plasma to be generated can be made extremely smaller as compared with that of a conventional structure. As a result, it is possible to remarkably increase the power efficiency.

Moreover, in the inner space of the chamber 107, since relatively uniform plasma can be generated in the direction toward the center axis, the plasma is made uniform in the longitudinal direction so that the substrate 102 can be more uniformly processed.

(Ninth Embodiment)

A ninth embodiment of the present invention will be described below with reference to FIG. 15.

Figure 15:
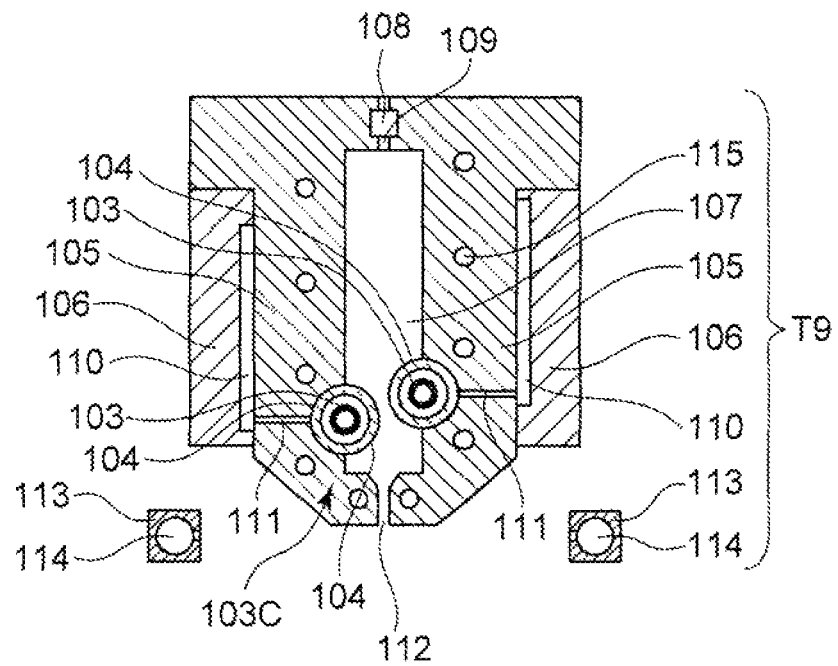
FIG. 15 is a cross-sectional view showing a structure of a plasma processing apparatus according to a ninth embodiment of the present invention.

FIG. 15 shows a structure of a plasma processing apparatus according to the ninth embodiment of the present invention, and is a cross-sectional view of an inductive coupling-type plasma torch unit T9 taken along a plane perpendicular to the longitudinal direction thereof. Since the ninth embodiment of the present invention is different from the eighth embodiment only in the numbers of the conductor rods 103 and the quartz pipes 104, the description other than these will be omitted.

In FIG. 15, only two conductor rods 103 (that is, two conductor rods 103 on the right-side lower end as well as on the left-side lower end in FIG. 9A) are prepared, and both of the two conductor rods 103 are long conductor rods 103a. These two conductor rods 103 are electrically connected with each other by the conductor link 123 so that a coil with the number of turn of 1 is formed.

In this structure, the volume of plasma to be generated is made smaller than that of the eighth embodiment so that the torch unit T9 having a superior power efficiency can be realized.

(Tenth Embodiment)

A tenth embodiment of the present invention will be described below with reference to FIG. 16.

Figure 16:
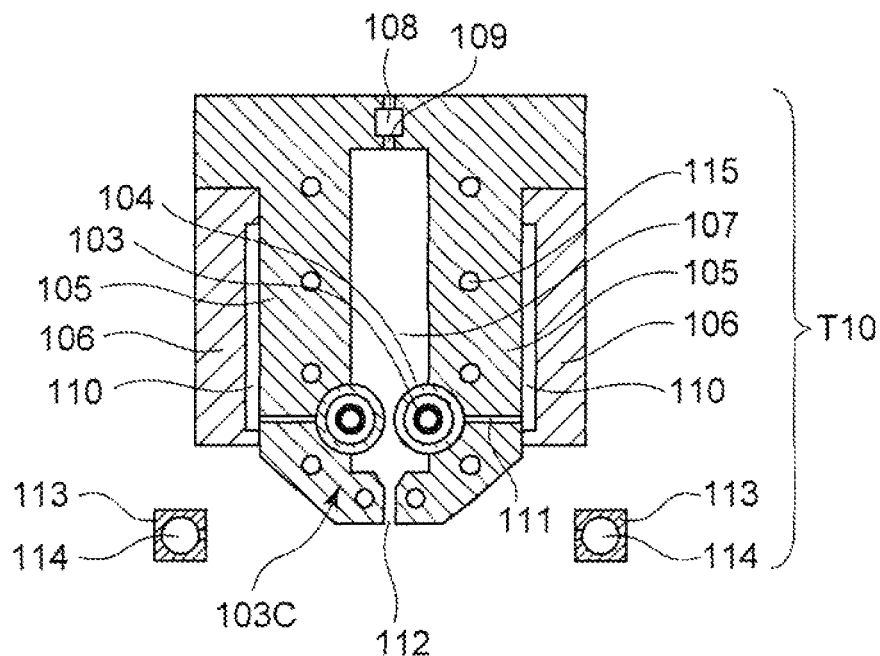
FIG. 16 is a cross-sectional view showing a structure of a plasma processing apparatus according to a tenth embodiment of the present invention.

FIG. 16 shows a structure of a plasma processing apparatus according to the tenth embodiment of the present invention, and is a cross-sectional view of an inductive coupling-type plasma torch unit T10 taken along a plane perpendicular to the longitudinal direction thereof. Since the tenth embodiment of the present invention is different from the ninth embodiment only in the arrangement of the conductor rods 103 and the quartz pipes 104, the description other than these will be omitted.

In FIG. 16, since two conductor rods 103 are disposed on positions having the same height, the two conductor rods 103 are disposed with the same distance from the ejection port 112, and by connecting the conductor rods 103 with the conductor link 123, a coil with the number of turn of 1 is formed.

In this structure, since the volume of plasma to be generated is made smaller than that of the ninth embodiment, it becomes possible to realize the torch unit T10 having superior power efficiency.

(Eleventh Embodiment)

An eleventh embodiment of the present invention will be described below with reference to FIGS. 17 and 18.

Figure 17:
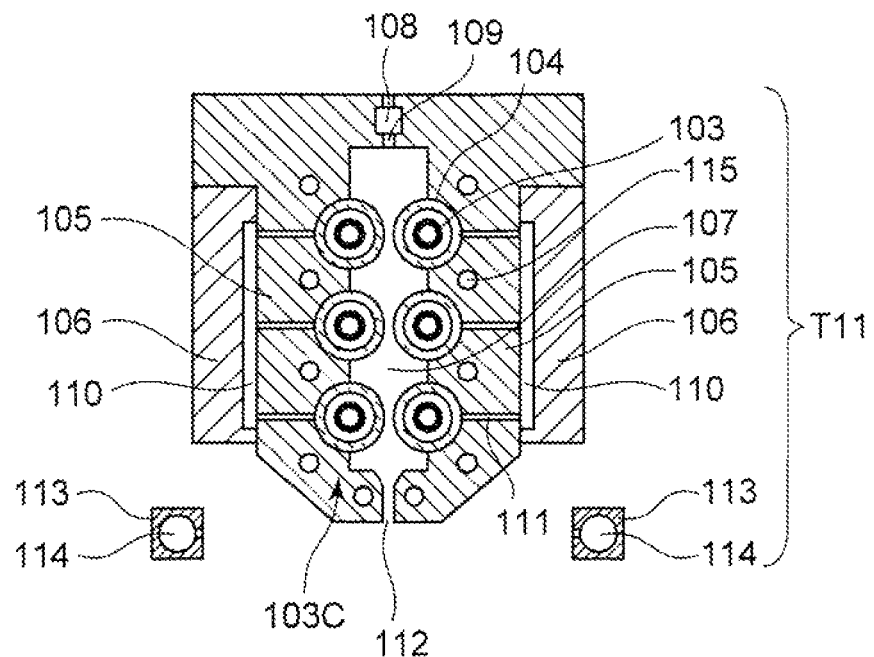
FIG. 17 is a cross-sectional view showing a structure of a plasma processing apparatus according to an eleventh embodiment of the present invention.

FIG. 17 shows a structure of a plasma processing apparatus according to the eleventh embodiment of the present invention, and is a cross-sectional view of an inductive coupling-type plasma torch unit T11 taken along a plane perpendicular to the longitudinal direction thereof. Since the eleventh embodiment of the present invention is only different from the eighth embodiment in the layouts of the conductor rods 103 and the quartz pipes 104, the description other than these will be omitted.

In FIG. 17, with respect to six conductor rods 103, since three conductor rods 103 on the right and left sides are respectively disposed in the same height, two conductor rods form a pair and are disposed at the same distance from the ejection port 112, and connected with one another by the conductor link 123 so that a coil with the number of turns of 3 is formed.

Alternatively, by connecting each pair of two conductor rods to different high-frequency power supplies, power to be supplied to the respective pairs can be independently controlled.

Figure 18:
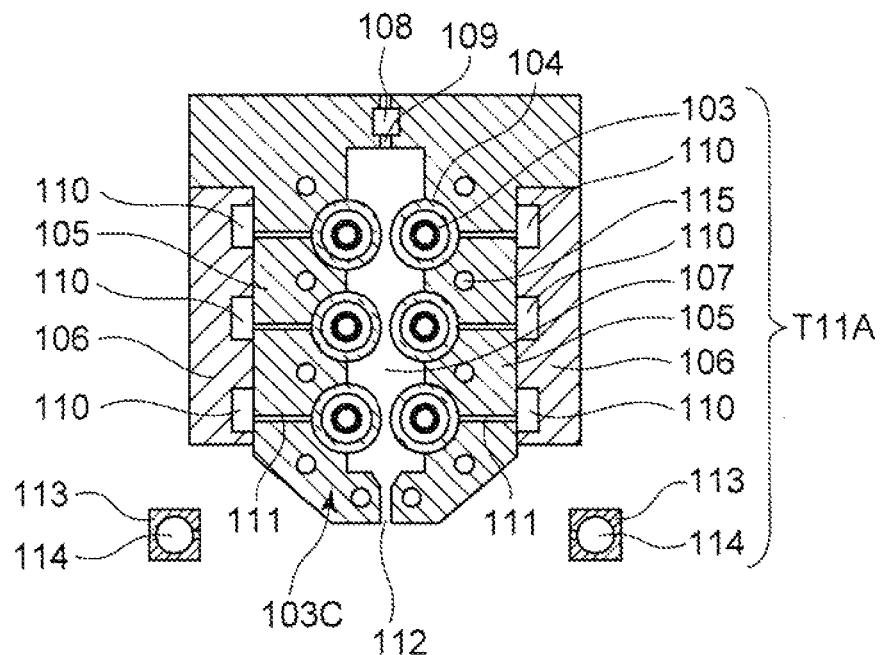
FIG. 18 is a cross-sectional view showing a structure of the plasma processing apparatus according to the eleventh embodiment of the present invention.

Moreover, as shown as an inductive coupling-type plasma torch unit T11A of FIG. 18, a sheath gas manifold 110 and a sheath gas supply hole 111 may be formed into different systems for every pairs. With this arrangement, it is possible to set a minimum amount of a sheath gas flow rate that is required for each of the pairs.

Alternatively, the independent controlling process for power to be supplied to each of the pairs and the arrangement in which the sheath gas manifold 110 and the sheath gas supply hole 311 are formed into different systems for each of the pairs can be simultaneously prepared. In this case, different types of gases are supplied to the respective systems, and its ionization degree is controlled by using power balances so that plasma processing having superior controllability can be carried out.

The plasma processing apparatuses and methods thereof as exemplified above are only typical examples within the scope of applications of the present invention.

For example, each of the inductive coupling-type plasma torch units T to T11A may be scanned relative to a fixed substrate mounting base 1 or 101, or the substrate mounting base 1 or 101 may be scanned relative to each of fixed inductive coupling-type plasma torch units T to T11A.

By using various structures of the present invention, it becomes possible to carry out high-temperature treatment on the proximity of the surface of a substrate 2 or 102, and in addition to applications to crystallization of a semiconductor film for use in TFTs, described in detail in the conventional example, or to modification of a semiconductor film for use in solar batteries, the present invention is also applicable to various surface treatments, such as cleaning or a reduction of degassing of a protective layer for a plasma display panel, a surface flattening process or a reduction of degassing of a dielectric layer made of aggregated bodies of silica fine particles, a reflow process of various electronic devices, or a plasma doping process using a solid impurity source. Moreover, with respect to a manufacturing method of solar batteries, the present invention is also applicable to a method in which powder, obtained by pulverizing a silicon ingot, is applied to a substrate and plasma is applied thereto to be fused so that a polycrystalline silicon film is obtained.

Moreover, another structure may be proposed in which plasma gas supply pipes 10 and 110 are surrounded by conductors that are grounded. In the case where the plasma gas supply pipes 10 and 110 are made of a dielectric material, the inside of the pipes is irradiated with a high-frequency electromagnetic field to sometimes cause an undesired discharge inside the pipes. By using the structure in which the plasma gas supply pipes 10 and 110 are surrounded by conductors that are grounded, such an undesired discharge can be effectively suppressed.

Figure 19:
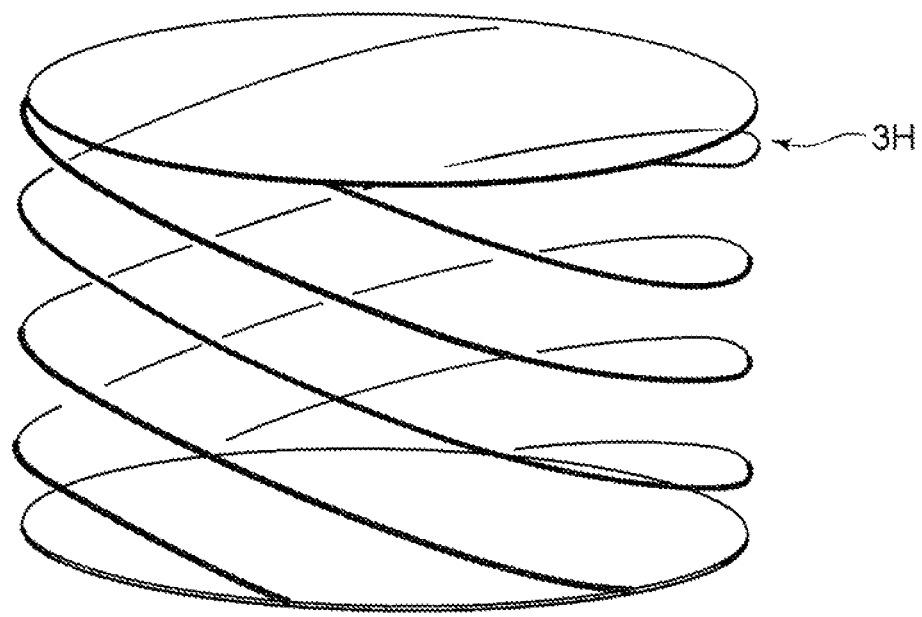
FIG. 19 is a perspective view showing an example of a spiral coil.
Figure 20:
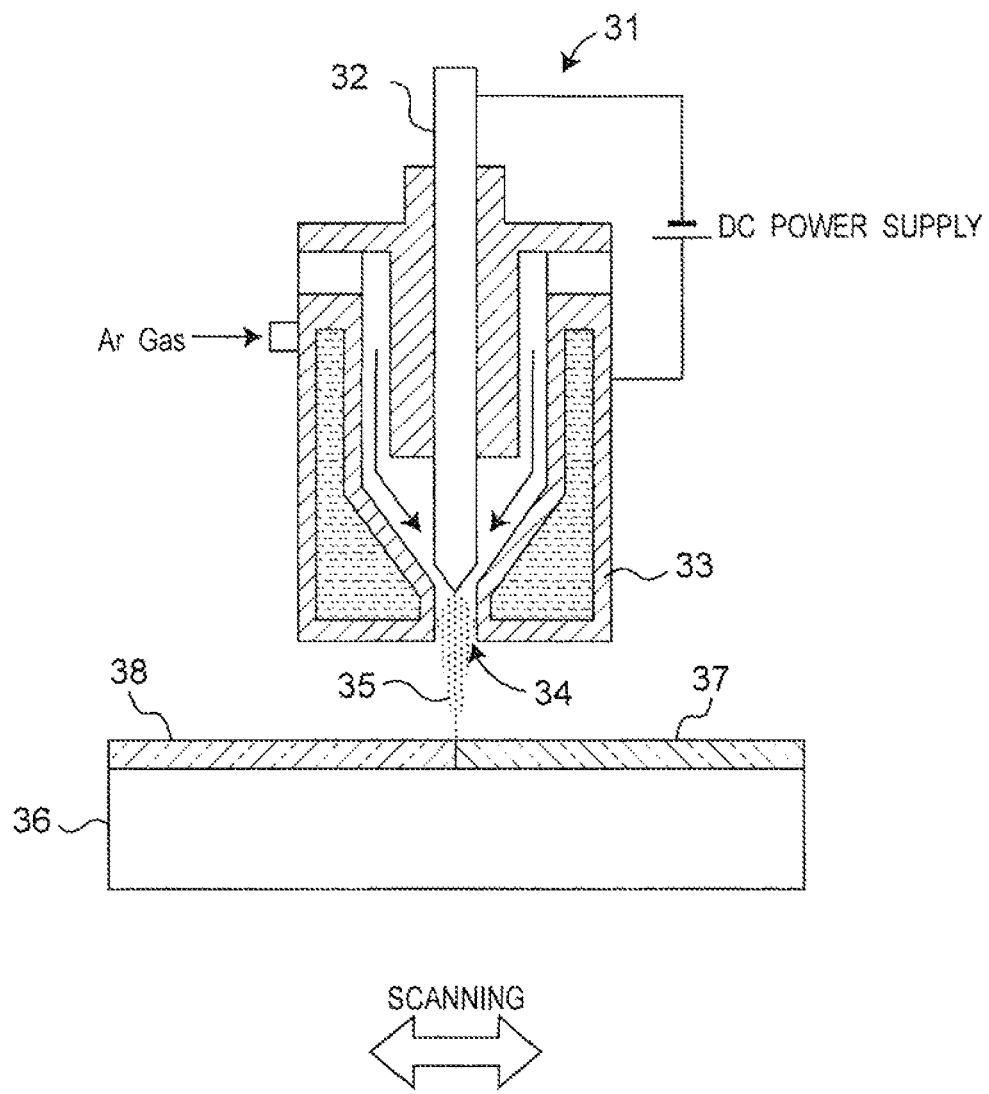
FIG. 20 is a cross-sectional view showing a structure of a plasma processing apparatus according to a conventional example.
Figure 21:
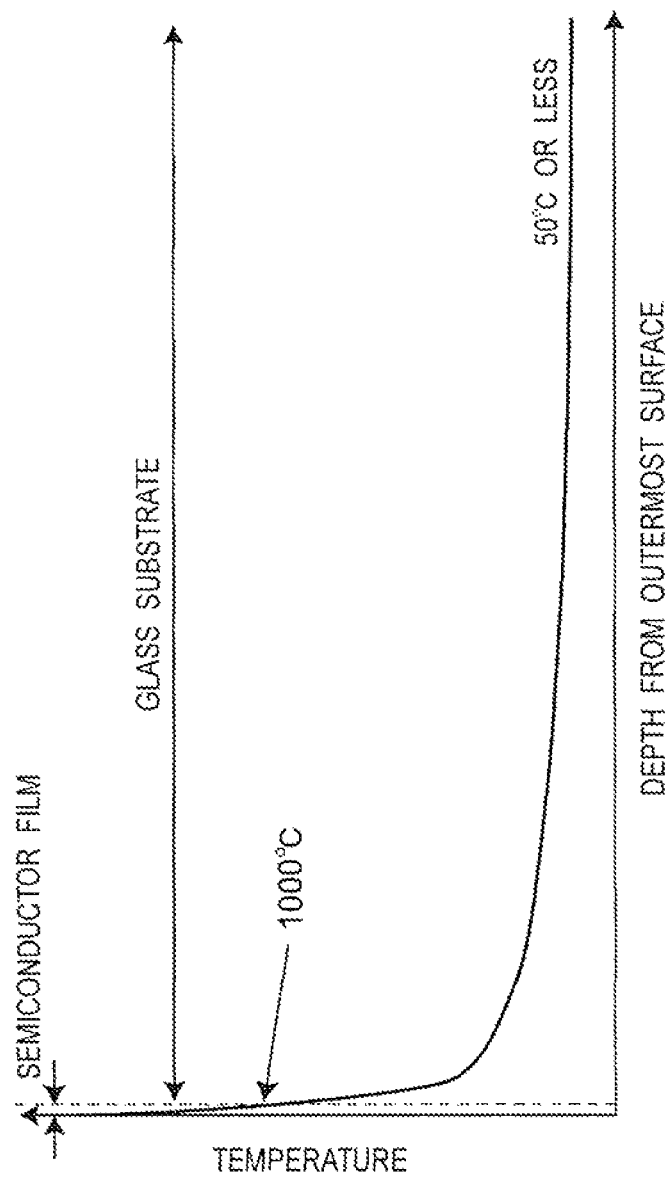
FIG. 21 is a conceptual view showing a relationship between the depth from the outermost surface and the temperature in the conventional example.

Moreover, the coil 3H having a spiral shape may be prepared to have a shape with multiple spirals, as disclosed in FIG. 19 (Japanese Unexamined Patent Publication No. 8-83696). By using this structure, the inductance of the coil can be reduced, and the power efficiency can be improved. This structure is particularly effective when the width of a substrate 2 to be processed is large, that is, when the inductive coupling-type plasma torch unit or the coil is long in the longitudinal direction.

Moreover, the gas ejection ports (openings) may be prepared as a plurality of dot-shaped openings, or may be linearly formed.

Furthermore, the structure using brass as metal, for a part material has been exemplified; however, among parts made of metal materials, it is possible to prevent a metal material from being mixed into plasma and also to suppress an arc discharge by coating portions corresponding to the inner walls of the chambers 7 and 107 with an insulator material.

Moreover, in order to easily ignite plasma, an ignition source may be used. As the ignition source, an ignition spark device for use in a gas hot-water supplier or the like may be used.

For convenience of description, a square substrate is illustrated as the substrate 2 or 102; however, the present invention is not limited thereto, and any shape such as a round shape may be utilized.

Moreover, for convenience of description, the term "thermal plasma" is used; however, strictly speaking, the distinction between "thermal plasma" and "low-temperature plasma" is very difficult, and, for example, as described in "Non-equilibrium in thermal plasma", Journal of Plasma Fusion Society, Vol. 82 No. 8 (2006) pp. 479-483, it is also difficult to distinguish the types of plasma only based upon thermal equilibrium. One of the objects of the present invention is to carry out thermal treatment on a substrate so that the present invention can be applied to techniques for applying high-temperature plasma, without being limited by the terms such as thermal plasma, thermally equilibrium plasma, or high-temperature plasma.

Moreover, although the process in which high-temperature heating treatment is uniformly carried out on the proximity of the surface of a substrate only for a short period of time has been exemplified in detail, the present invention may also be applied to a process in which low-temperature plasma process is carried out on a substrate by applying plasma derived from a reaction gas or simultaneously applying plasma and a reaction gas flow to the substrate. By mixing a plasma gas or a sheath gas with a reaction gas, plasma derived from the reaction gas is applied to a substrate so that an etching or CVD process can be realized. Alternatively, as one example of the plasma gas or the sheath gas, a rare gas or a gas prepared by mixing a small amount of $H_2$ gas with a rare gas is used, while, as one example of the shield gas, a gas containing a reaction gas is supplied so that by simultaneously applying the plasma and the reaction gas flow to a substrate, a plasma processing such as an etching, CVD, or doping process can also be realized. When a gas mainly composed of argon is used as the plasma gas or sheath gas, thermal plasma is generated as exemplified in the embodiments in detail. On the other hand, when a gas including helium as a main component is used as the plasma gas or sheath gas, relatively low-temperature plasma can be generated.

By using these methods, an etching or film-forming process can be carried out without heating the substrate too much. As the reaction gas for use in etching, a halogen-containing gas, for example, CxFy (x and y are natural numbers), $SF_6$, or the like are proposed so as to carry out an etching process on silicon or silicon compounds. By using $O_2$ as the reaction gas, a removing process of an organic substance or a resist ashing process can be carried out. As the reaction gas for use in CVD, for example, monosilane or disilane is proposed so as to carry out a film-forming process of silicon or a silicon compound. Alternatively, by using a mixed gas between an organic gas containing silicon, typically represented by TEOS (Tetraethoxysilane), and $O_2$, a film-forming process of a silicon oxide film can be executed.

In addition to these, various low-temperature plasma processing operations such as surface treatments for improving water repellency or hydrophilicity can be carried out. As compared with the conventional technique (for example, the technique described in Japanese Unexamined Patent Publication No. 2007-287454), since the present invention uses inductive coupling-type materials, a transition to an arc discharge hardly occurs even when a high power density per unit volume is applied, and plasma with high density can be generated, thereby making it possible to obtain a high reaction speed and consequently to carry out treatment on the entire desired processing region of a substrate in a shorter period of time.

Moreover, the conductor rods 3 and 103 have been exemplified as one example of the conductor member; however, the conductor member is not limited to the rod-shaped member, and a plate-shaped member may also be used.

Among the above-mentioned various embodiments and modified examples, by combining desired embodiments and modified examples with one another on demand, it is possible to obtain the respective effects.

As described above, the present invention is applicable to crystallization of a semiconductor film for use in TFTs or modification of a semiconductor film for use in solar batteries. Of course, the present invention provides an effective method by which, in various surface treatments such as cleaning or a reduction of degassing of a protective layer for a plasma display panel, a surface flattening process or a reduction of degassing of a dielectric layer made of aggregated bodies of silica fine particles, a reflow process of various electronic devices, or a plasma doping process using a solid impurity source, the entire desired processing area of a substrate can be processed in a short time upon carrying out high-temperature thermal treatment uniformly on the proximity of a surface of the substrate for only a very short period of time.

Moreover, the present invention provides an effective method by which, in low-temperature plasma processes such as an etching, or film-forming, or surface-modifying process, upon producing various electronic devices or the like, the entire desired processing area of the substrate can be processed in a short time.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:
   a case having a chamber that communicates with an opening having a slit shape, and is surrounded by a dielectric member;
   a gas supply device for supplying a gas to the chamber through a gas introducing port;
   a conductive unit that is disposed in a manner so as to bridge over the chamber in the case and generates a high-frequency electromagnetic field in the chamber;
   a high-frequency power supply that supplies high-frequency power to the conductive unit; and
   a substrate mounting base on which a substrate is mounted, and which is disposed so as to face the opening,
   wherein a longitudinal direction of the chamber and a longitudinal direction of the opening are disposed in parallel with each other, and
   the conductive unit is formed by electrically connecting a plurality of conductor members that are disposed in parallel with the longitudinal direction of the chamber, with the chamber being sandwiched therebetween.

2. The plasma processing apparatus according to claim 1, wherein each of the conductor members is surrounded by a dielectric member, and one portion of the dielectric member surrounding the conductor members is disposed to be exposed to a space inside the chamber.

3. The plasma processing apparatus according to claim 1, further comprising:
   a shifting device that allows the chamber and the substrate mounting base to shift relative to each other in a direction perpendicular to the longitudinal direction of the opening.

4. A plasma processing apparatus comprising:
   a case having a chamber that communicates with an opening having a slit shape, and is surrounded by a dielectric member;
   a gas supply device for supplying a gas to the chamber through a gas introducing port;
   a conductive unit that is disposed in a manner so as to bridge over the chamber in the case and generates a high-frequency electromagnetic field in the chamber;
   a high-frequency power supply that supplies high-frequency power to the conductive unit; and
   a substrate mounting base on which a substrate is mounted, and which is disposed so as to face the opening,
   wherein a longitudinal direction of the chamber and a longitudinal direction of the opening are disposed in parallel with each other, and
   the conductive unit is formed by electrically connecting a plurality of conductor members that are disposed in parallel with the longitudinal direction of the chamber, with the chamber being sandwiched therebetween,
   wherein the case is formed by surrounding a periphery of the dielectric member with a conductor.

5. A plasma processing apparatus comprising:
   a case having a chamber that communicates with an opening having a slit shape, and is surrounded by a dielectric member;
   a gas supply device for supplying a gas to the chamber through a gas introducing port;
   a conductive unit that is disposed in a manner so as to bridge over the chamber in the case and generates a high-frequency electromagnetic field in the chamber;
   a high-frequency power supply that supplies high-frequency power to the conductive unit; and
   a substrate mounting base on which a substrate is mounted, and which is disposed so as to face the opening,
   wherein a longitudinal direction of the chamber and a longitudinal direction of the opening are disposed in parallel with each other, and
   the conductive unit is formed by electrically connecting a plurality of conductor members that are disposed in parallel with the longitudinal direction of the chamber, with the chamber being sandwiched therebetween,
   wherein each conductor member has a hollow tube shape and a coolant is allowed to flow through an inner space defined by a tube formed by the conductor member so that the conductor member is cooled.

6. A plasma processing apparatus comprising:
   a case having a chamber that communicates with an opening having a slit shape, and is surrounded by a dielectric member;
   a gas supply device for supplying a gas to the chamber through a gas introducing port;

a conductive unit that is disposed in a manner so as to bridge over the chamber in the case and generates a high-frequency electromagnetic field in the chamber;

a high-frequency power supply that supplies high-frequency power to the conductive unit; and a substrate mounting base on which a substrate is mounted, and which is disposed so as to face the opening, wherein a longitudinal direction of the chamber and a longitudinal direction of the opening are disposed in parallel with each other, and the conductive unit is formed by electrically connecting a plurality of conductor members that are disposed in parallel with the longitudinal direction of the chamber, with the chamber being sandwiched therebetween, and wherein a dielectric block is placed in the case, with the conductor members being installed in respective elongated holes of the dielectric block formed near the chamber, in parallel with the chamber so that the conductor members are surrounded by the dielectric member.

7. The plasma processing apparatus according to claim 6, wherein, on a cross-section taken along a plane perpendicular to the longitudinal direction, that includes the chamber, a shortest distance from each conductor member to a conductor other than the conductor member is set to be longer than a shortest distance from the conductor member to the chamber.

8. The plasma processing apparatus according to claim 6, wherein the chamber surrounded by the dielectric member is prepared as a slit formed in the dielectric block, with the elongated holes being formed near the slit of the dielectric block.

9. The plasma processing apparatus according to claim 6, wherein the high-frequency power supply supplies the high-frequency power to the plurality of conductor members that are made to face each other with the chamber interposed therebetween, so as to allow high-frequency currents with reversed phases to flow through the plurality of conductor members that are made to face each other with the chamber interposed therebetween.

10. The plasma processing apparatus according to claim 6, wherein, among the plurality of conductor members, the high-frequency power supply supplies the high-frequency power to the plurality of conductor members that are made to face each other with the chamber interposed therebetween, so as to allow high-frequency currents with the same phase to flow through the conductor members that are made to face each other with the chamber interposed therebetween.

11. The plasma processing apparatus according to claim 6, wherein the elongated holes are designed to function as a coolant passage that allows a coolant to flow therethrough.

12. The plasma processing apparatus according to claim 6, wherein a space is formed between the case that is grounded and the dielectric block, and the space is filled with an abnormal discharge preventive gas.

13. A plasma processing apparatus comprising:

a case having a chamber that communicates with an opening having a slit shape, and is surrounded by a dielectric member;

a gas supply device for supplying a gas to the chamber through a gas introducing port;

a conductive unit that is disposed in a manner so as to bridge over the chamber in the case and generates a high-frequency electromagnetic field in the chamber;

a high-frequency power supply that supplies high-frequency power to the conductive unit;

a substrate mounting base on which a substrate is mounted, and which is disposed so as to face the opening, wherein a longitudinal direction of the chamber and a longitudinal direction of the opening are disposed in parallel with each other;

a shifting device that allows the chamber and the substrate mounting base to shift relative to each other in a direction perpendicular to the longitudinal direction of the opening;

a shield gas supply member having a shield gas introducing port for supplying a shield gas, the shield gas supply member that is placed in parallel with the longitudinal direction of the opening, in a separate manner from the gas introducing port, and formed on a surface opposed to the opening; and a shield gas supply device for supplying the shield gas from the shield gas introducing port, wherein the conductive unit is formed by electrically connecting a plurality of conductor members that are disposed in parallel with the longitudinal direction of the chamber, with the chamber being sandwiched therebetween.

14. A plasma processing apparatus comprising:

a case having a chamber that communicates with an opening having a slit shape, and is surrounded by a dielectric member;

a gas supply device for supplying a gas to the chamber through a gas introducing port;

a conductive unit that is disposed in a manner so as to bridge over the chamber in the case and generates a high-frequency electromagnetic field in the chamber;

a high-frequency power supply that supplies high-frequency power to the conductive unit;

a substrate mounting base on which a substrate is mounted, and which is disposed so as to face the opening, wherein a longitudinal direction of the chamber and a longitudinal direction of the opening are disposed in parallel with each other; and a shifting device that allows the chamber and the substrate mounting base to shift relative to each other in a direction perpendicular to the longitudinal direction of the opening, wherein the conductive unit is formed by electrically connecting a plurality of conductor members that are disposed in parallel with the longitudinal direction of the chamber, with the chamber being sandwiched therebetween, wherein one portion of an inner wall of the chamber is made of a conductor block, and a dielectric tube is fitted to a fitting concave portion for the dielectric tube, formed in the conductor block, and a gas introducing passage for introducing a gas into the chamber through a gap between the concave portion of the conductor block and the dielectric tube is formed in the case, and a dielectric tube protective gas supply device for supplying a dielectric tube protective gas to the gas introducing passage is further installed.

* * * * *